US012675054B2

(12) United States Patent
Lee et al.

(10) Patent No.: US 12,675,054 B2
(45) Date of Patent: Jul. 7, 2026

(54) COATING AND DEVELOPING DEVICE

(71) Applicants:ACM RESEARCH (SHANGHAI), INC., Shanghai (CN); ACM Research Korea CO., LTD., Gyeong-gi-do (KR); CleanChip Technologies Limited, Hong Kong (CN)

(72) Inventors: Mark Lee, Gyeong-gi-do (KR); Jun Wu, Shanghai (CN); Hui Wang, Shanghai (CN); Cheng Cheng, Shanghai (CN); Andrew Jung, Gyeong-gi-do (KR); Bruce Sohn, Gyeong-gi-do (KR); Wenjun Wang, Shanghai (CN); Qian Shao, Shanghai (CN); Jun Wang, Shanghai (CN); Deyun Wang, Shanghai (CN); Yy Kim, Gyeong-gi-do (KR)

(73) Assignees: ACM RESEARCH (SHANGHAI), INC., Shanghai (CN); ACM Research Korea CO., LTD., Gyeong-Gi-Do (KR); CleanChip Technologies Limited, Hong Kong (CN)

( * ) Notice: Subject to any disclaimer, the term of this patent is extended or adjusted under 35 U.S.C. 154(b) by 215 days.

(21) Appl. No.: 18/684,915

(22) PCT Filed: Aug. 20, 2021

(86) PCT No.: PCT/CN2021/113899
§ 371 (c)(1),
(2) Date: Feb. 20, 2024

(87) PCT Pub. No.: WO2023/019590
PCT Pub. Date: Feb. 23, 2023

(65) Prior Publication Data
US 2025/0130511 A1 Apr. 24, 2025

(51) Int. Cl.
*G03F 7/20* (2006.01)
*G03F 7/00* (2006.01)
(Continued)

(52) U.S. Cl.
CPC .......... *G03F 7/70991* (2013.01); *G03F 7/168* (2013.01); *G03F 7/2022* (2013.01);
(Continued)

(58) Field of Classification Search
CPC .... G03F 7/70991; G03F 7/168; G03F 7/2022; G03F 7/2041; G03F 7/7075;
(Continued)

(56) References Cited

U.S. PATENT DOCUMENTS

2001/0013161 A1 8/2001 Kitano et al.
2008/0241403 A1 10/2008 Matsuoka et al.
(Continued)

FOREIGN PATENT DOCUMENTS

CN 101276744 A 10/2008
CN 101794710 A 8/2010
(Continued)

OTHER PUBLICATIONS

Office Action issued in corresponding KR Application No. 20247009092 dated Jul. 24, 2025 (9 pages).
(Continued)

*Primary Examiner* — Mesfin T Asfaw
(74) *Attorney, Agent, or Firm* — Osha Bergman Watanabe & Burton LLP

(57) ABSTRACT

A coating and developing device comprises a front end module (100), a process station (200), and an interface station (300) that are successively connected, wherein the process station (200) comprises a coating unit (210), a developing unit (220), at least one transversely moving of mobile conveying part (230), and at least one side robot
(Continued)

(R0). After a substrate has been processed in the coating unit (210), the substrate is transferred to the mobile conveying part (230) by the at least one side robot (R0), and the substrate is transferred to the interface station (300) by the mobile conveying part (230). After the substrate has been processed in the developing unit (220), the substrate is transferred to the mobile conveying part (230) by the at least one side robot (R0), and the substrate is transferred to the front end module (100) by the mobile conveying part (230). The mobile conveying part (230) and the side robot (R0) are configured to be responsible for transferring the substrate between the front end module (100) and the interface station (300) reducing the operating load of the robot in the coating unit (210) or the developing unit (220), and improving the throughput of the coating and developing device.

18 Claims, 26 Drawing Sheets

(51) Int. Cl.
    G03F 7/16 (2006.01)
    H10P 72/00 (2026.01)
    H10P 72/76 (2026.01)
(52) U.S. Cl.
    CPC .......... G03F 7/2041 (2013.01); G03F 7/7075 (2013.01); G03F 7/70875 (2013.01); G03F 7/70925 (2013.01); H10P 72/0474 (2026.01); H10P 72/7602 (2026.01)
(58) Field of Classification Search
    CPC ............. G03F 7/70875; G03F 7/70925; H01L 21/67225; H01L 21/68707; H01L 21/67173; H01L 21/6715; H01L 21/67178; H01L 21/67184; H01L 21/67745; H01L 21/67028; H01L 21/67098; H01L 21/67721
    See application file for complete search history.

(56) References Cited

U.S. PATENT DOCUMENTS

| | | |
|---|---|---|
| 2010/0192844 A1 | 8/2010 | Kim |
| 2011/0014562 A1 | 1/2011 | Matsuoka |
| 2014/0161983 A1* | 6/2014 | Inagaki ............. H01L 21/67184 |
| | | 134/32 |

FOREIGN PATENT DOCUMENTS

| | | | |
|---|---|---|---|
| CN | 104600003 | A | 5/2015 |
| CN | 105321829 | A | 2/2016 |
| CN | 104465460 | B | 9/2017 |
| CN | 112582318 | A | 3/2021 |
| JP | H10261689 | A | 9/1998 |
| JP | 2002033266 | A | 1/2002 |
| JP | 2008258208 | A | 10/2008 |
| KR | 20080089240 | A | 10/2008 |
| KR | 20190053340 | A | 5/2019 |

OTHER PUBLICATIONS

Office Action issued in corresponding JP Application No. 2024510522 dated Jun. 3, 2025 (6 pages).
Office Action issued in corresponding TW Application No. 110145747 dated Jul. 31, 2025 (7 pages).
International Search Report issued for corresponding international patent application No. PCT/CN2021/113899, mailed May 19, 2022 (4 pages).
Written Opinion issued for corresponding international patent application No. PCT/CN2021/113899, mailed May 19, 2022 (3 pages).
Extended European Search Report issued in European Application No. 21953831.1 mailed on Nov. 25, 2025. (13 pages).
Notice of Reasons of Refusal issued in Japanese Application No. 2024-510522 mailed on Dec. 22, 2025 (8 pages).

* cited by examiner

CNCN

COATING AND DEVELOPING DEVICE

BACKGROUND OF THE INVENTION

1. Field of the Invention

The present invention generally relates to the field of semiconductor manufacturing equipment, and more particularly relates to a coating and developing device.

2. The Related Art

At present, the inline machine to realize the photolithographic process is composed of a coating and developing device and an exposing machine. The general process of the photolithographic process is as follows: After the substrate is coated on the coating and developing device, it is sent to the exposing machine for exposure processing, and the exposed substrate is returned to the coating and developing device to complete the development process.

A conventional coating and developing device, as described in patent reference 1 (CN104465460B), comprises a carrier block, a processing block, and an interface block in sequence. The processing block comprises four layers of coating unit blocks arranged in layers, and developing unit blocks stacked on the top of the coating unit blocks. Each layer of unit block is disposed with a robot that moves horizontally in its central handling area. Due to the design requirements of the total height of the device, there may not be enough space for each layer of unit block to be disposed with fan filter units (FFU), which cannot ensure the cleanliness of the process environment within each layer of unit block, and ultimately increase the risk of particle pollution on the substrate surface.

In addition, the robot in the unit block of each layer is busy with transferring the substrate between the processing modules in the unit block (such as a coating module, a developing module or a heating processing module), but also busy with transferring the substrate between the carrier block and the interface block, which will cause the robot to be very busy, and will inhibit the operation efficiency of the device.

SUMMARY

The present invention discloses a coating and developing device and a substrate transfer method, which can reduce the risk of substrate particle pollution and improve the overall operation efficiency of the device.

The coating and developing device disclosed by the present invention comprises a front end module, a process station and an interface station, which are successively connected, wherein the process station comprises:

a coating unit, comprising at least one line of vertically stacked coating modules for performing coating treatment to the substrate;

a developing unit, comprising at least one line of vertically stacked developing modules for performing developing treatment to the substrate;

at least one transversally moving of mobile conveying part; and at least one vertically moving of side robot;

wherein after the substrate has been processed in the coating unit, the substrate is transferred to the mobile conveying part by at least one side robot, and is transferred to the interface station by the mobile conveying part; after the substrate has been processed in the developing unit, the substrate is transferred to the mobile conveying part by at least one side robot and is transferred to the front end module by the mobile conveying part.

The vertical layout of the coating modules in the coating unit enables multiple layers of coating modules to share the same coating robot, which reduces the number of FFU installed in the coating unit and makes process environment control be easier. The developing unit can use a small amount of FFU to ensure the cleanliness of the internal environment of the entire unit.

The transversally moving of the mobile conveying part and the vertically moving of the side robot effectively cooperate, so that the substrate having been processed in the coating unit or the developing unit is quickly transferred to the interface station or the front end module, which can improve the operation efficiency of the device.

As an optional solution of the present invention, the coating unit further comprises at least one line of vertically stacked heating processing modules, located opposite the coating modules, for heating and cooling the substrate before and after the coating treatment; and the developing unit further comprises at least one line of vertically stacked heating processing modules, located opposite the developing modules, for heating and cooling the substrate before and after the developing treatment.

As an optional solution of the present invention, at least one mobile conveying part is located on the top or the bottom of the coating unit and the developing unit.

As an optional solution of the present invention, the coating unit further comprises at least one coating robot, for transferring the substrate between the coating modules and the heating processing modules of the coating unit; and the developing unit further comprises at least one developing robot, for transferring the substrate between the developing modules and the heating processing modules of the developing unit.

Multiple lines of vertically stacked coating modules in the coating unit can share the same coating robot, so only one fan filter unit (FFU) is disposed in the coating unit to ensure a clean process atmosphere and reduce environmental particle pollution on the substrate. Similarly, the developing unit can also be disposed with only one FFU to achieve a clean internal environment and reduce particle pollution. Therefore, the vertical layout of the coating modules and the developing modules makes easier to control the coating or developing treatment environment.

As an optional solution of the present invention, at least one mobile conveying part is located between the top and bottom of the coating unit and the developing unit.

As an optional solution of the present invention, the coating unit comprises at least one coating robot located at the upper side of the mobile conveying part and at least one coating robot located at the lower side of the mobile conveying part located between the top and bottom of the coating unit and the developing unit, for transferring the substrate between the coating modules and the heating processing modules of the coating unit; and the developing unit comprises at least one developing robot located at the upper side of the mobile conveying part and at least one developing robot located at the lower side of the mobile conveying part located between the top and bottom of the coating unit and the developing unit, for transferring the substrate between the developing modules and the heating processing modules of the developing unit.

When the mobile conveying part is located between the top and bottom of the coating unit and the developing unit, the transversally arranged mobile conveying part divides the internal space of the coating unit and the developing unit into several relatively independent subspaces, for example, when a pair of mobile conveying parts is disposed between the top and bottom of the coating unit and the developing unit, the pair of transversally arranged mobile conveying parts separate the coating unit and developing unit into relatively independent upper space and lower space. At this time, the upper space and the lower space are each configured with a coating robot and a developing robot. Similarly, in order to ensure the clean process environment, the upper space and the lower space are each configured with an FFU to control the internal environment of each unit.

As an optional solution of the present invention, at least one side robot is arranged between the coating unit and the developing unit, for transferring the substrate to the mobile conveying part after the substrate has been processed in the coating unit, or transferring the substrate to the mobile conveying part after the substrate has been processed in the developing unit.

As an optional solution of the present invention, the process station comprises at least two side robots, at least one of the at least two side robots is arranged between the coating unit and the front end module, for transferring the substrate to the mobile conveying part after the substrate has been processed in the coating unit, or taking the substrate from the mobile conveying part after the substrate has been processed in the developing unit; and at least one of the at least two side robots is arranged between the developing unit and the interface station for transferring the substrate to the mobile conveying part after the substrate has been processed in developing unit, or taking the substrate from the mobile conveying part after the substrate has been processed in the coating unit.

The side robots are arranged at both sides of the process station, and the side robot between the coating unit and the developing unit is cancelled. On the one hand, the length of the device can be shortened and the device footprint can be reduced. On the other hand, the shortening of the motion travel of the mobile conveying part is conducive to improving the transfer efficiency, thus improving the operation efficiency of the entire device.

As an optional solution of the present invention, the process station comprises at least three side robots, at least one of the at least three side robots is disposed between the coating unit and the front end module for taking the substrate from the mobile conveying part after the substrate has been processed in the developing unit;

at least one of the at least three side robots is disposed between the coating unit and the developing unit for transferring the substrate to the mobile conveying part after the substrate has been processed in the coating unit, or transferring the substrate to the mobile conveying part after the substrate has been processed in the developing unit; and at least one of the at least three side robots is disposed between the developing unit and the interface station for taking the substrate from the mobile conveying part after the substrate has been processed in the coating unit.

As an optional solution of the present invention, the front end module comprises a front end module robot, and the front end module robot takes the substrate from the mobile conveying part after the substrate has been processed in the developing unit; and the interface station comprises an interface robot, and the interface robot takes the substrate from the mobile conveying part after the substrate has been processed in the coating unit.

The present invention also provides a substrate transfer method of the coating and developing device, wherein, a front end module robot is disposed in the front end module, and the front end module robot takes the substrate from the front end module and transfers the substrate to the process station;

a coating robot is disposed in the coating unit of the process station, the coating robot transfers the substrate into the coating unit, and the coating treatment and heating treatment are performed to the substrate in the coating unit;

the coating robot takes the substrate out of the coating unit after the substrate has been processed in the coating unit;

the side robot transfers the substrate which is taken from the coating unit to the mobile conveying part;

the mobile conveying part transfers the substrate which has been processed in the coating unit to the interface station;

an interface robot is disposed in the interface station, the interface robot takes the substrate which has been processed in the coating unit from the mobile conveying part and transfers the substrate to the interface station, or another side robot takes the substrate from the mobile conveying part after the substrate has been processed in the coating unit, and then the interface robot transfers the substrate to the interface station;

the interface robot takes the substrate from the interface station and transfers the substrate to the process station after the substrate has completed of exposure processing;

a developing robot is disposed in the developing unit of the process station, the developing robot transfers the substrate to the developing unit, and the developing treatment and heating treatment are performed to the substrate in the developing unit;

the developing robot takes the substrate which has been processed in the developing unit out of the developing unit;

the side robot transfers the substrate into the mobile conveying part after the substrate is taken out of the developing unit;

the mobile conveying part transfers the substrate to the front end module after the substrate has been processed in the developing unit;

the front end module robot takes the substrate which has been processed in the developing unit from the mobile conveying part and transfers the substrate into the front end module, or another side robot takes the substrate from the mobile conveying part after the substrate has been processed in the developing unit, and then the front end module robot transfers the substrate into the front end module.

DETAILED DESCRIPTION OF EMBODIMENTS

Figure 1:
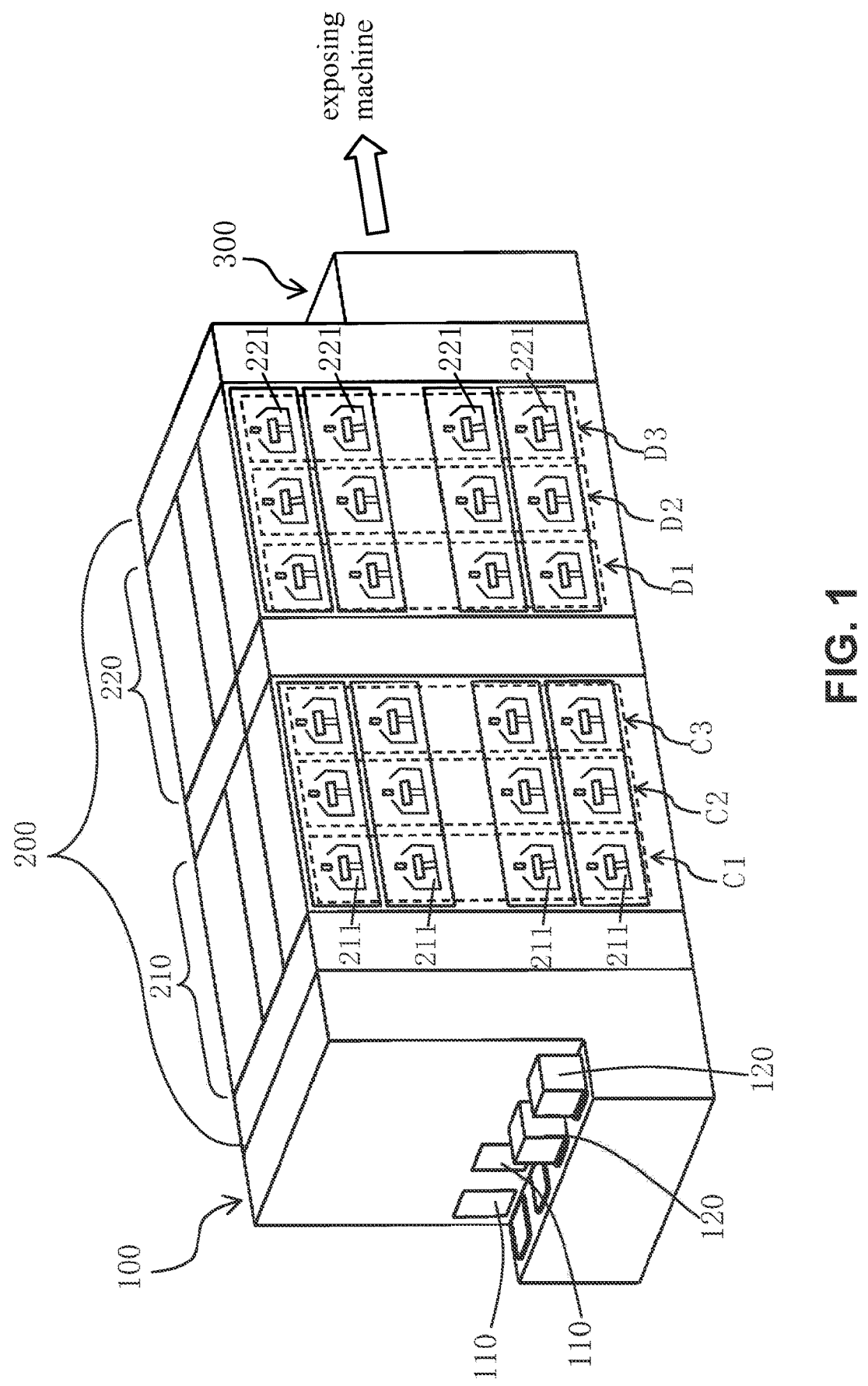
FIG. 1 illustrates a front perspective view of a coating and developing device of Embodiment 1 of the present invention.

In order to explain the technical content, structural features, objectives and effects of the present invention in detail, the embodiments and drawings will be described in detail below.

The present invention discloses a coating and developing device, comprising a front end module (EFEM), a process station and an interface station which are sequentially connected. The front end module is disposed with a front end module robot (EFEM robot) and the interface station is disposed with an interface robot.

The process station comprises a coating unit, a developing unit, at least one mobile conveying part capable of transversally moving and at least one side robot capable of vertically moving. After the substrate has been processed in the coating unit, the substrate is moved into the mobile conveying part by the side robot and transferred to the interface station by the mobile conveying part. After the substrate has been processed in the developing unit, the substrate is moved into the mobile conveying part by the side robot and transferred to the front end module by the mobile conveying part.

The coating unit comprises at least one line of vertically stacked coating modules, at least one line of vertically stacked heating processing modules, and at least one coating robot. The coating modules are used to perform coating treatment to the substrate. The heating processing modules are used to heat and cool the substrate before and after the coating treatment, and the heating processing modules are located at the opposite side of the coating modules. The coating robot is used to transfer the substrate between the coating modules and the heating processing modules of the coating unit.

The developing unit comprises at least one line of vertically stacked developing modules, at least one line of vertically stacked heating processing modules, and at least one developing robot. The developing modules are used to perform developing treatment to the substrate. The heating processing modules are used to heat and cool the substrate before and after the developing treatment, and the heating processing modules are located at the opposite side of the developing modules. The developing robot is used to transfer the substrate between the developing modules and the heating processing modules of the developing unit.

At least one transversally moving of mobile conveying part is located at the top or the bottom of the coating unit and the developing unit, or at least one transversally moving of mobile conveying part is located between the top and bottom of the coating unit and the developing unit. When at least one transversally moving of mobile conveying part is located between the top and bottom of the coating unit and the developing unit, the coating unit is disposed with at least one coating robot located at the upper side of the mobile conveying part and at least one coating robot located at the lower side of the mobile conveying part, for transferring the substrate between the coating modules and the heating processing modules of the coating unit. The developing unit is disposed with at least one developing robot located at the upper side of the mobile conveying part and at least one developing robot located at the lower side of the mobile conveying part, for transferring the substrate between the developing modules and the heating processing modules of the developing unit.

The side robot is disposed between the front end module and the coating unit, or between the coating unit and the developing unit, or between the developing unit and the interface station.

The following will be combined with specific embodiments to introduce the position and number of side robot settings in detail, as well as the corresponding substrate transfer method.

Embodiment 1

Figure 2:
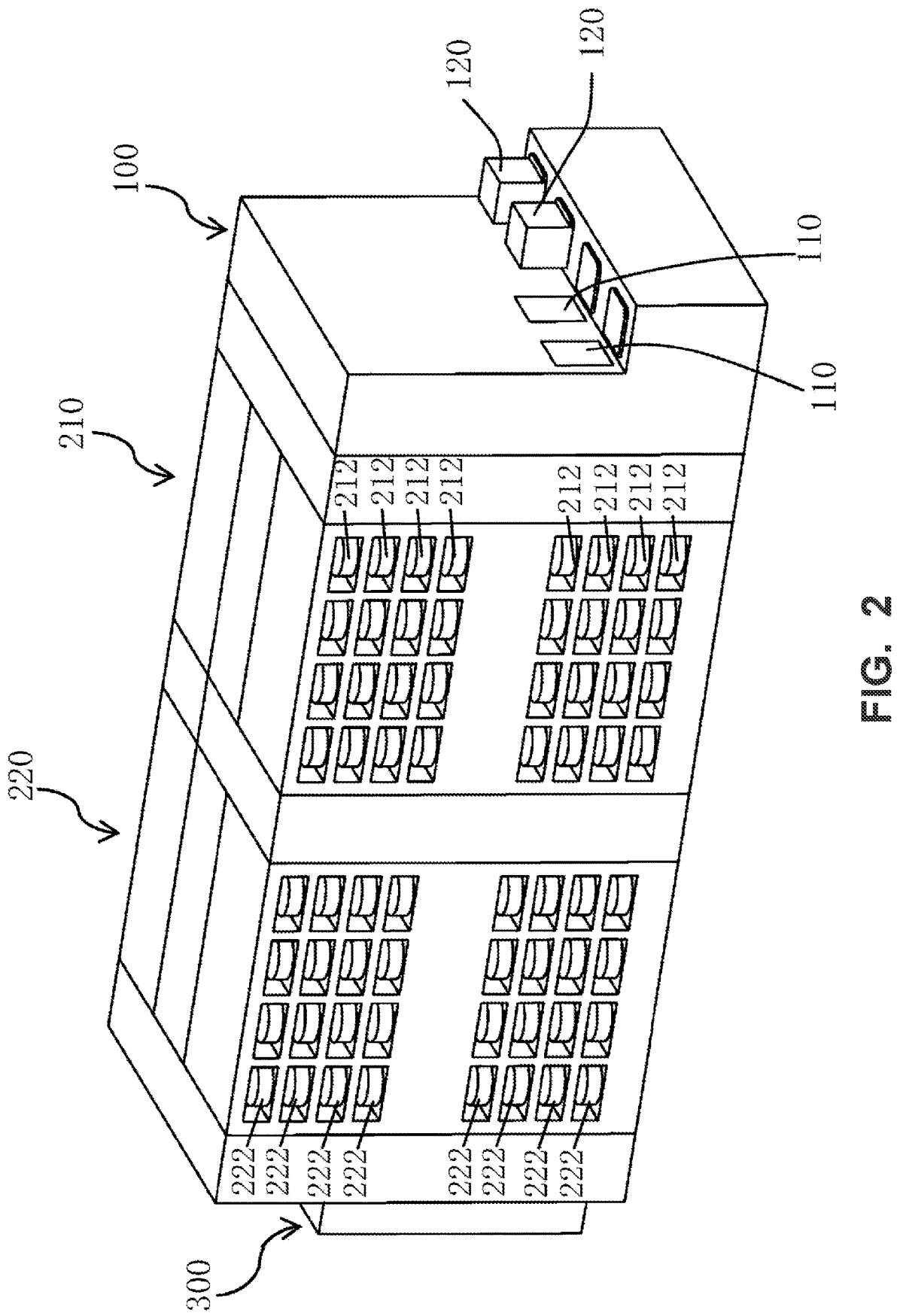
FIG. 2 illustrates a rear perspective view of the coating and developing device of Embodiment 1 of the present invention.
Figure 3:
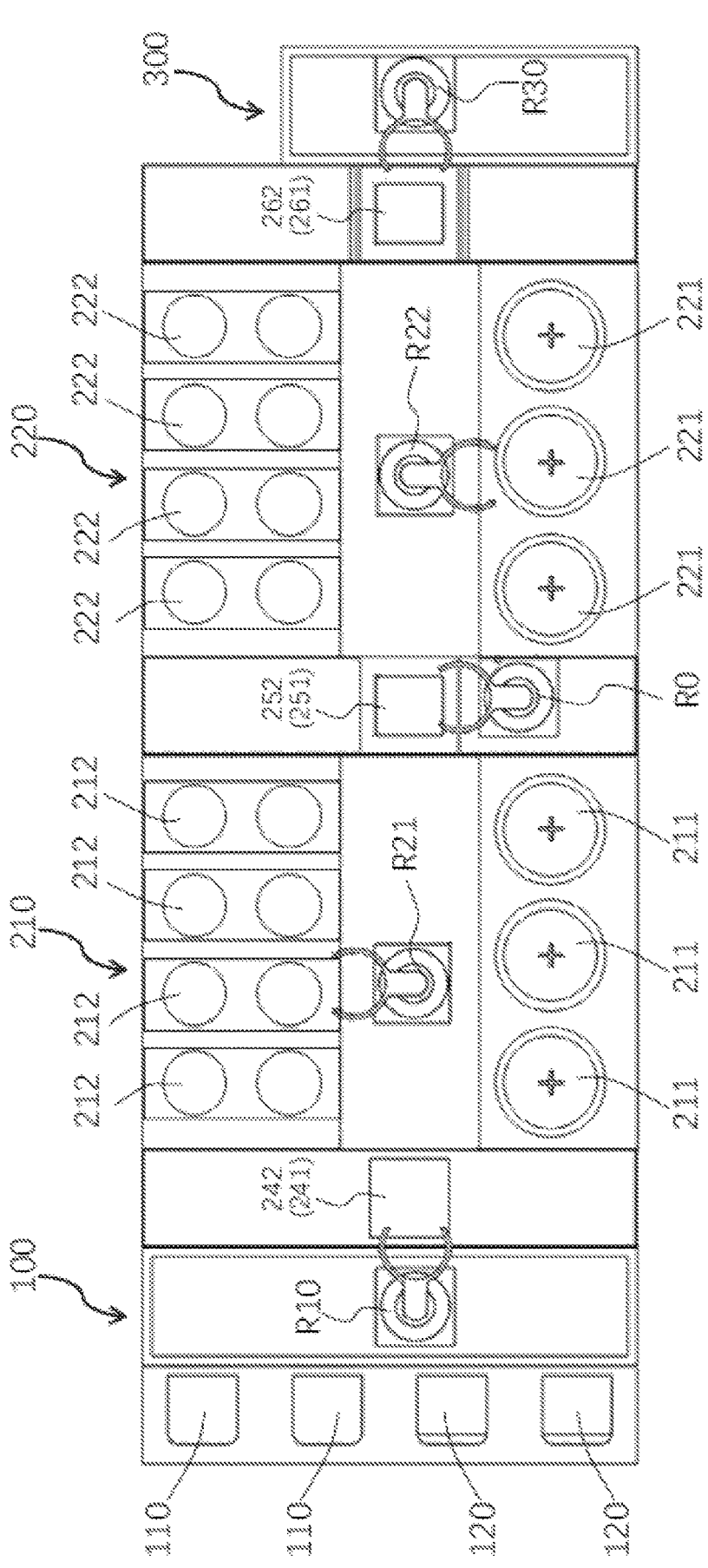
FIG. 3 illustrates a cross-sectional view of the coating and developing device of Embodiment 1 of the present invention.

Please refer to FIG. 1 to FIG. 7, illustrating a coating and developing device according to the embodiment of the present invention. FIG. 1 and FIG. 2 show a perspective view of the coating and developing device of the present invention. The coating and developing device mainly includes a front end module (EFEM) 100, a process station 200 and an interface station 300. FIG. 3 shows a cross sectional view of the coating and developing device in this embodiment. The front end module 100 has a plurality of loading ports 110 for holding one or more substrate cassettes 120 containing multiple substrates. An EFEM robot R10 is installed in the front end module 100 to transfer the substrate between the EFEM 100 and the process station 200. The interface station 300 is used to connect external equipment, such as an exposing machine, to expose the substrate after the substrate has been processed in the coating unit 210. An interface robot R30 is installed in the interface station 300 to transfer the substrate between the process station 200 and the interface station 300.

Figure 4:
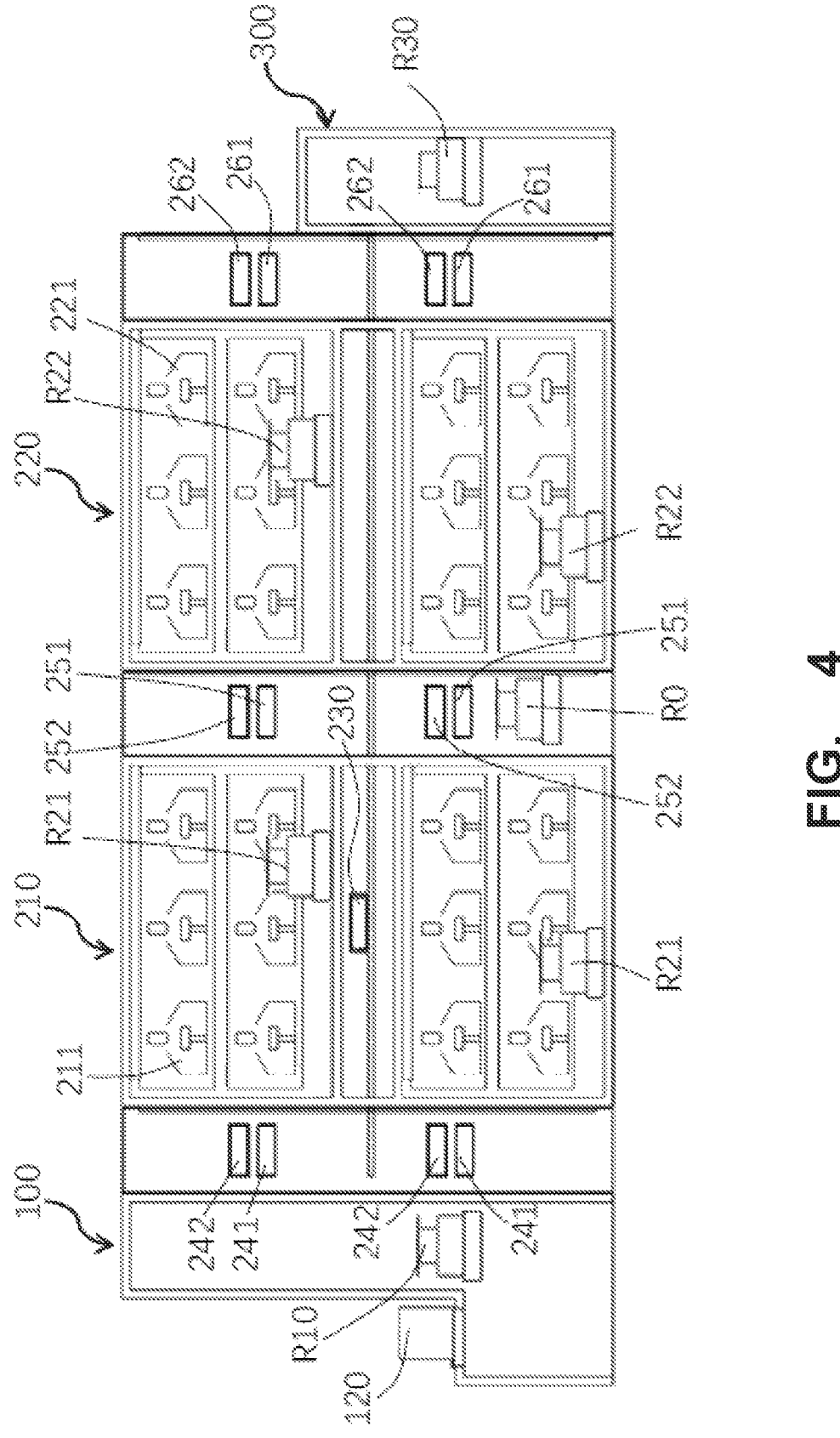
FIG. 4 illustrates a longitudinally cross-sectional view of the coating and developing device of Embodiment 1 of the present invention.
Figure 25A:
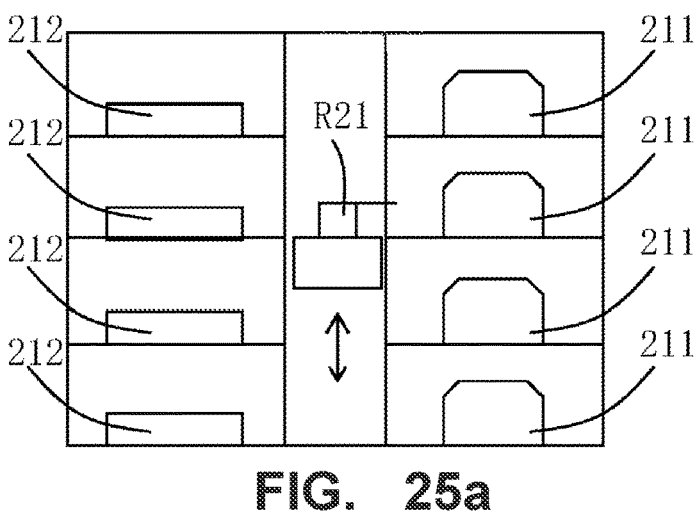
FIG. 25*a* to FIG. 25*c* illustrate longitudinal layout diagrams of coating modules and heating modules in a coating unit.
Figure 25B:
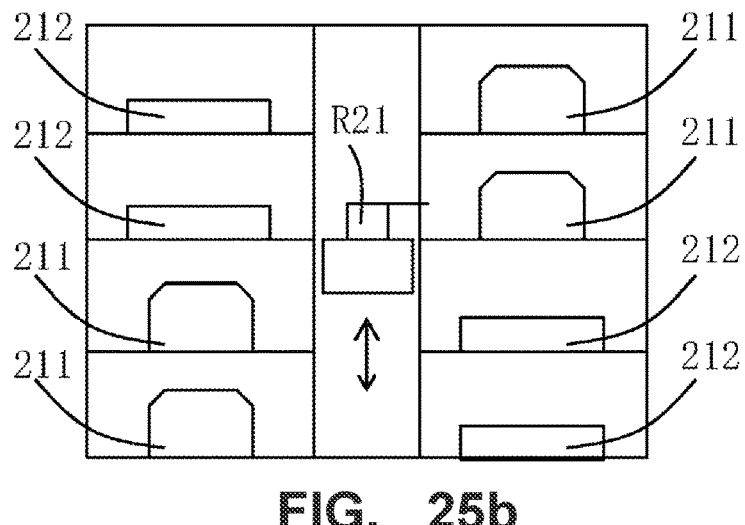
Figure 25C:
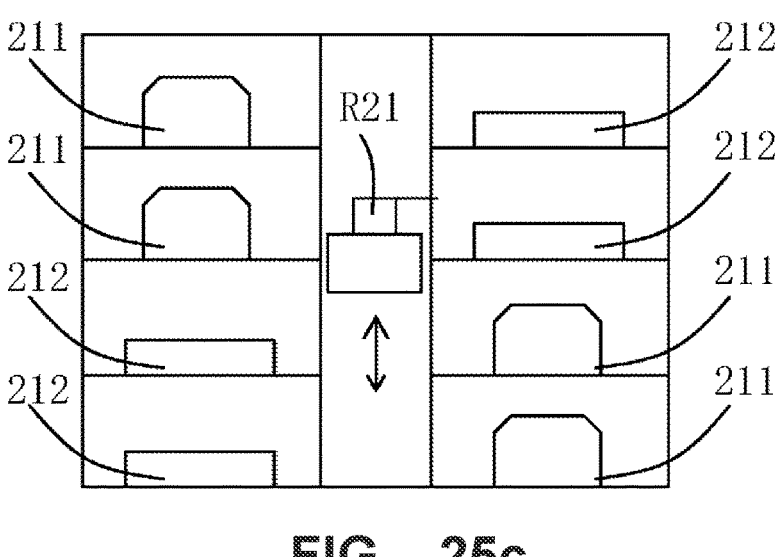
Figure 26A:
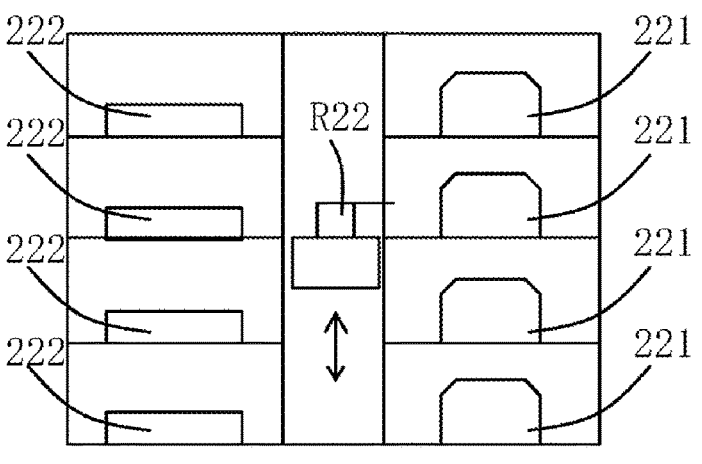
FIG. 26*a* to FIG. 26*c* illustrate longitudinal layout diagrams of developing modules and heating modules in a developing unit.
Figure 26B:
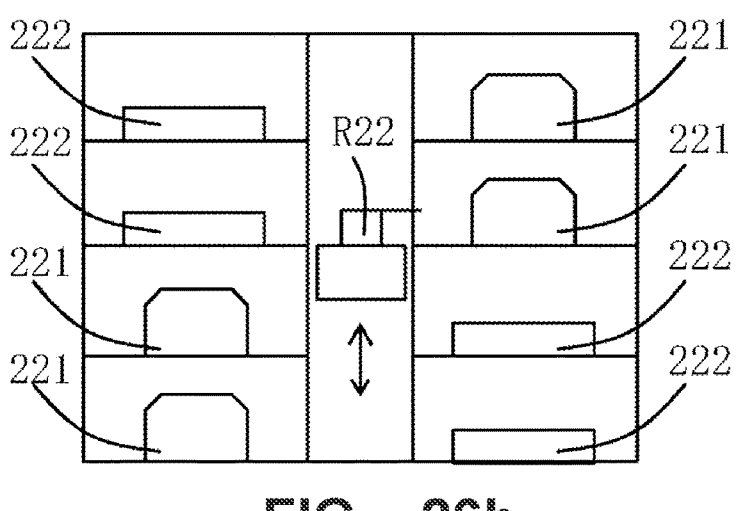
Figure 26C:
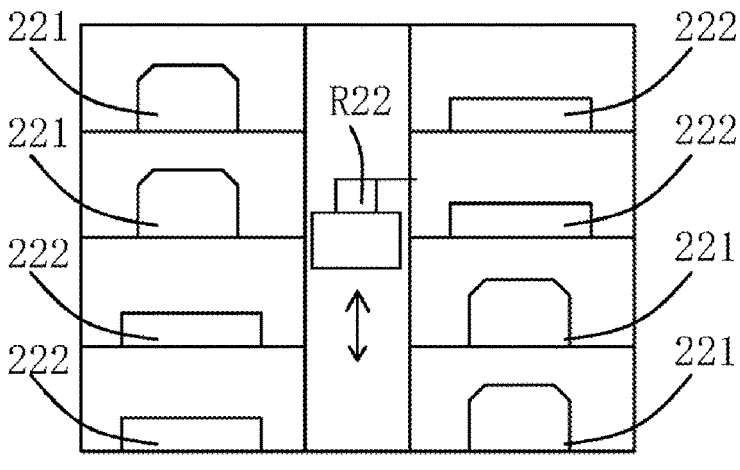

The process station 200 comprises a coating unit 210 and a developing unit 220, at least one mobile conveying part 230 capable of moving transversely (for example, horizontal direction in FIG. 4), and at least one side robot R0 capable of moving vertically (for example, vertical direction in FIG. 4). The coating unit 210 is used to perform coating and heating treatment on the substrate and comprises at least one line of vertically stacked coating modules 211, at least one line of vertically stacked heating processing modules 212, and at least one coating robot R21. The coating modules 211 and the heating processing modules 212 are arranged relative to each other. FIG. 25a to FIG. 25c show various layouts of the coating modules 211 and the heating processing modules 212 relative to each other. The coating modules 211 are used to perform coating treatment to the substrate, and the heating processing modules 212 are used to perform heating and cooling treatment to the substrate, and the coating robot R21 is used to transfer the substrate between the coating modules 211 and the heating processing modules 212 of the coating unit 210. The developing unit 220 is used to perform developing and heating treatment on the substrate and comprises at least one line of vertically stacked developing modules 221, at least one line of vertically stacked heating processing modules 222, and at least one developing robot R22. The developing modules 221 and the heating processing modules 222 are arranged relative to each other. FIG. 26a to FIG. 26c show various layouts of the developing modules 221 and the heating processing modules 222 relative to each other. The developing modules 221 are used to perform developing treatment to the substrate, and the heating processing modules 222 are used to perform heating and cooling treatment to the substrate. The developing robot R22 is used to transfer the substrate between the developing modules 221 and the heating processing modules 222 of the developing unit 220. After the substrate is processed in the coating unit 210, the substrate is moved into the mobile conveying part 230 by the side robot R0, and the substrate is transferred to the interface station 300 by the mobile conveying part 230. After the substrate is processed in the developing unit 220, the substrate is moved into the mobile conveying part 230 by the side robot R0, and the substrate is transferred to the front end module 100 by the mobile conveying part 230.

Compared with the prior art in which a robot inside the coating unit or developing unit to transfer the substrate between EFEM and the interface station, in the embodiment of the present invention, a separate mobile conveying part and a side robot are configured to transfer the coated or developed substrate between the EFEM and the interface station, thereby reducing the operating load of the robot inside the coating unit or the developing unit. Therefore, the effect of robot operation efficiency on the throughput of the coating and developing device is reduced, and the throughput of the coating and developing device is improved.

As shown in FIG. 1, in this embodiment, the coating unit 210 comprises three lines of vertically stacked coating modules C1 to C3, each of which comprises four coating modules 211, and the developing unit 220 comprises three lines of vertically stacked developing modules D1 to D3, each of which comprises four developing modules 221. The number of lines and numbers of coating, developing and heating processing modules in the coating and developing unit can be adjusted according to the specific process capacity and device size requirements.

It should be noted that the coating modules mentioned in the embodiments of the present invention may comprise three types, namely, coating modules for forming photoresist coating, coating modules for forming top anti-reflective coating, and coating modules for forming bottom anti-reflective coating. The coating unit is configured with the corresponding coating modules according to the specific process requirements. Among them, the same type of coating modules can share liquid supply nozzles, or they can be configured with liquid supply nozzles separately, and different types of coating modules are configured with liquid supply nozzles separately.

Figure 5:
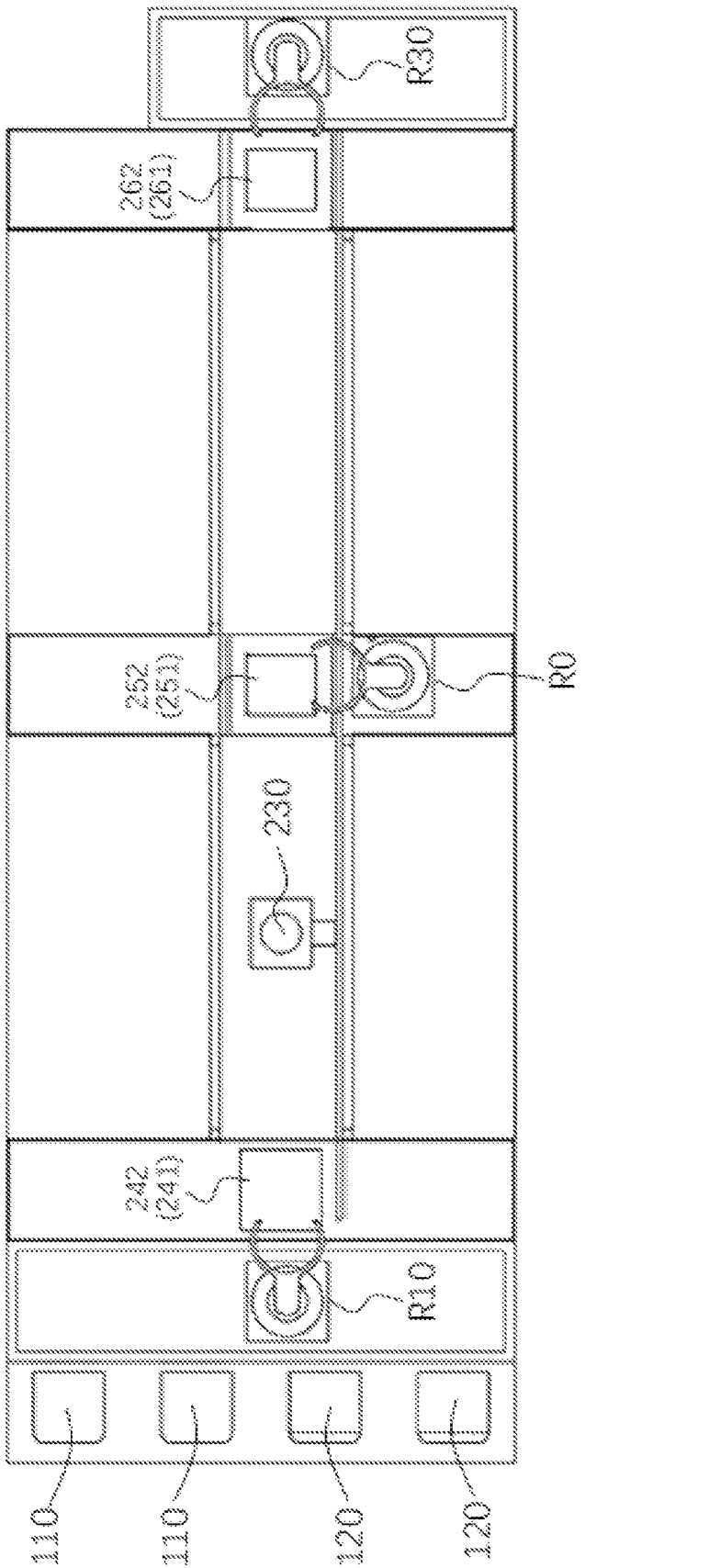
FIG. 5 illustrates another cross-sectional view of the coating and developing device of Embodiment 1 of the present invention.

Referring to FIG. 4 and FIG. 5, a transversally moving of mobile conveying part 230 is disposed between the top and bottom of the coating unit 210 and the developing unit 220. The mobile conveying part 230 is capable of transversally moving on a straight transfer path connecting the EFEM 100 and the interface station 300. The coating unit 210 is installed with two coating robots R21. One coating robot R21 is located at the upper side of the mobile conveying part 230 for transferring substrates between the coating modules 211 and the heating processing modules 212 on the upper side of the mobile conveying part 230, and the other coating robot R21 is located at the lower side of the mobile conveying part 230 for transferring substrates between the coating modules 211 and the heating processing modules 212 on the lower side of the mobile conveying part 230. The developing unit 220 is installed with two developing robots R22. One developing robot R22 is located at the upper side of the mobile conveying part 230 for transferring substrates between the developing modules 221 and the heating processing modules 222 located on the upper side of the mobile conveying part 230, and the other developing robot R22 is located at the lower side of the mobile conveying part 230 for transferring substrates between the developing modules 221 and the heating processing modules 222 located on the lower side of the mobile conveying part 230. In other embodiments, a plurality of transversally moving of mobile conveying parts may also be disposed between the top and bottom of the coating unit and the developing unit, and the coating unit is installed with at least one coating robot separately at the upper side and lower side of the mobile conveying part located between the top and bottom of the coating unit and the developing unit for transferring substrates between the coating modules and the heating processing modules of the coating unit. The developing unit is installed with at least one developing robot separately at the upper side and lower side of the mobile conveying part located between the top and bottom of the coating unit and the developing unit for transferring substrates between the developing modules and the heating processing modules of the developing unit.

Figure 6:
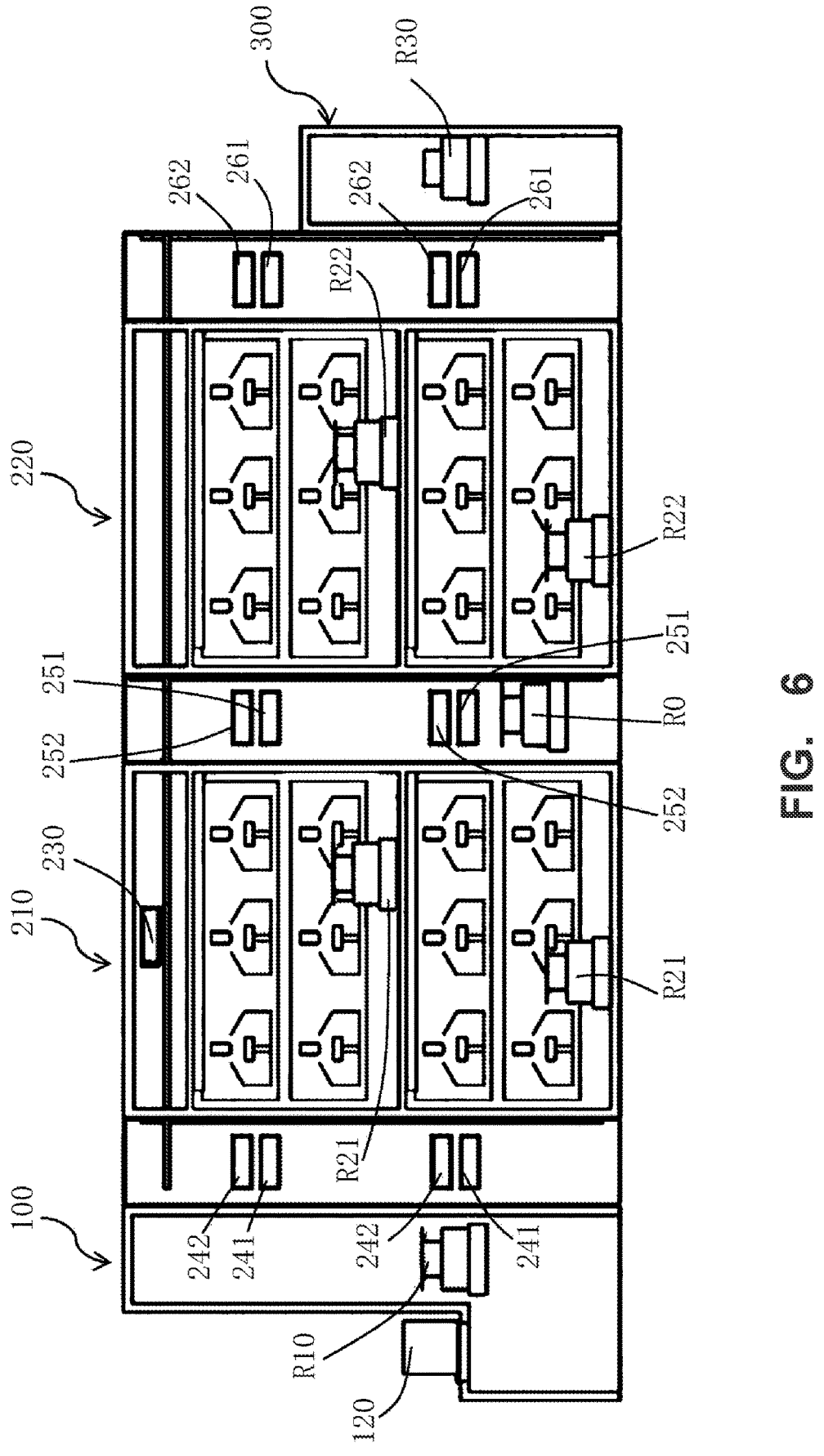
FIG. 6 illustrates another longitudinally cross-sectional view of the coating and developing device of Embodiment 1 of the present invention.
Figure 7:
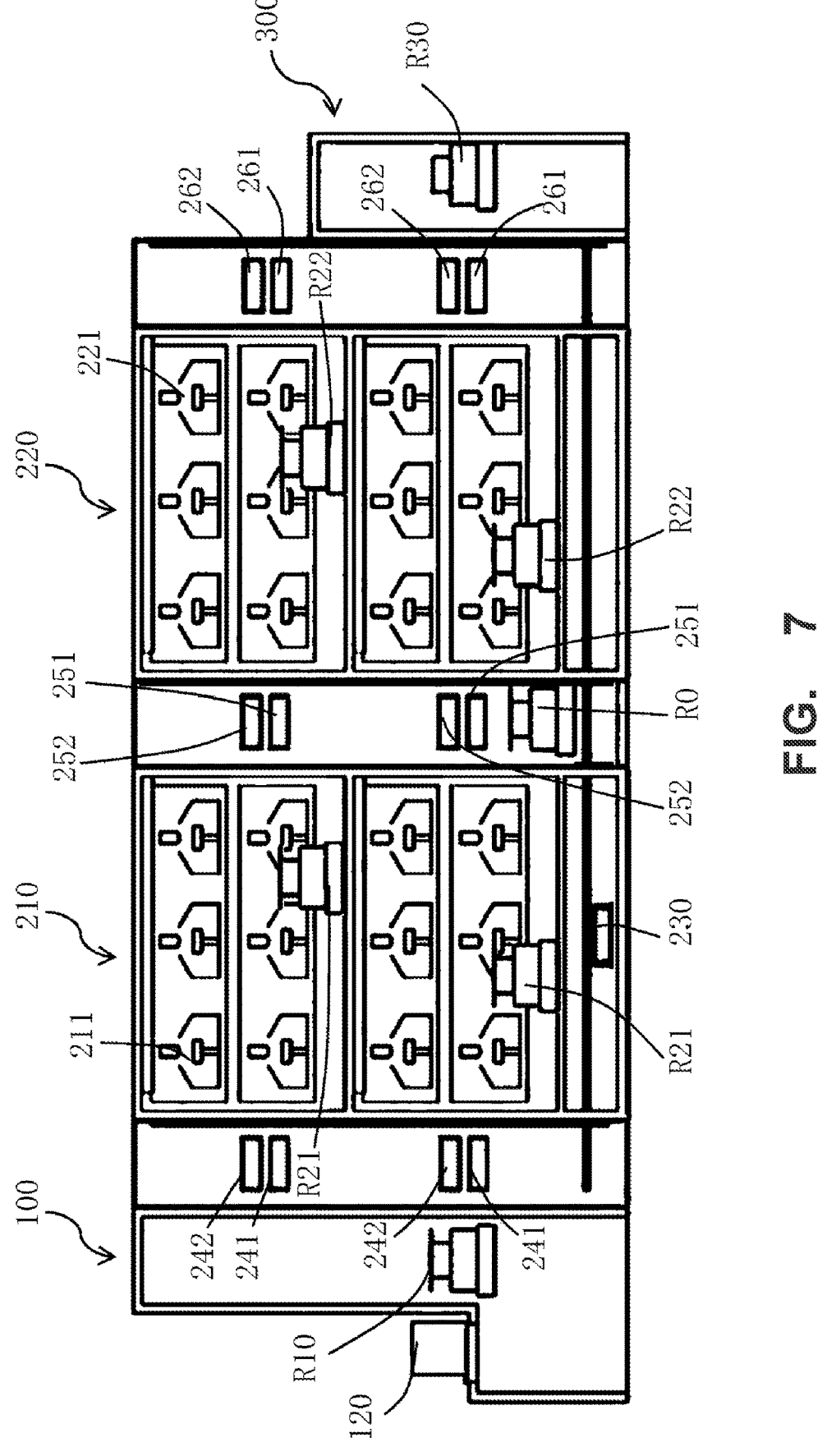
FIG. 7 illustrates another longitudinally cross-sectional view of the coating and developing device of Embodiment 1 of the present invention.

In other embodiments, the mobile conveying part 230 can also be disposed on the top or bottom of the coating unit 210 and the developing unit 220, as shown in FIG. 6 and FIG. 7 respectively. When the mobile conveying part 230 is located at the top or bottom of the coating unit 210 and the developing unit 220, the coating unit 210 is configured with at least one coating robot, for example, two, as shown in FIG. 6 or FIG. 7, and the coating unit 210 is divided into an upper space and a lower space. One coating robot R21 is used to transfer substrates between the coating modules 211 and the heating processing modules 212 located in the upper space of coating unit 210. Another coating robot R21 is used to transfer substrates between the coating modules 211 and the heating processing modules 212 located in the lower space of coating unit 210. At this time, the upper space of coating unit 210 and the lower space of coating unit 210 are equipped with a fan filter unit (FFU) to ensure a clean process environment in the upper and lower spaces of coating unit 210. Of course, the coating unit 210 can also be configured with only one coating robot R21 which is used to transfer substrates between all the coating modules 211 and the heating processing modules 212 in the entire space of coating unit 210. In this case, the coating unit 210 only needs to be configured with one fan filter unit (FFU) to realize the clean process environment of coating unit 210, which makes the control of the device process environment easier to operate. Similarly, the developing unit 220 can be configured with only one developing robot R22 or multiple developing robots R22.

In Embodiment 1, a side robot R0 is configured between the coating unit 210 and the developing unit 220 for moving the substrate after the substrate has been processed in the coating unit 210 or the developing unit 220 into the mobile conveying part 230. To facilitate the transfer of substrates between different robots, a first buffer part (241,242) is configured between the EFEM 100 and the coating unit 210, a second buffer part (251,252) is configured between the coating unit 210 and the developing unit 220, and a third buffer part (261, 262) is configured between the developing unit 220 and the interface station 300. The buffer part can accommodate multiple substrates and make the substrates stay, and the side robot R0 can move vertically up and down along the height direction of the coating and developing device to access the buffer parts at different heights.

Figures 8A, 8B:
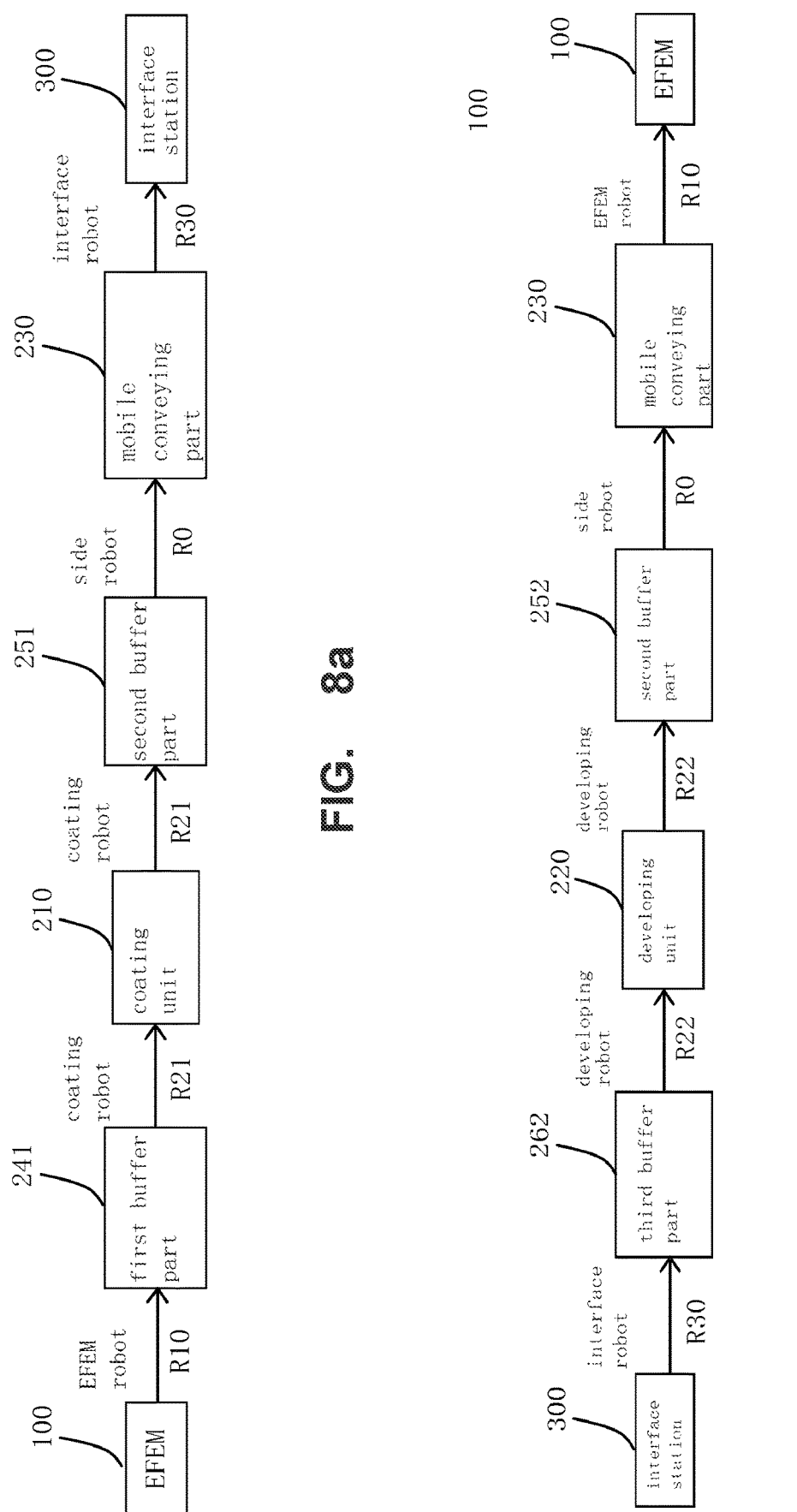
FIG. 8*a* illustrates the transport path of the substrate in the coating and developing device before exposure processing in Embodiment 1 of the present invention.
FIG. 8*b* illustrates the transport path of the substrate in the coating and developing device after exposure processing in Embodiment 1 of the present invention.

FIG. 8a shows the transfer method of substrates in the coating and developing device prior to exposure processing in Embodiment 1. The substrate to be processed is taken from the front end module 100 and transferred to the first buffer part 241 by the EFEM robot R10, and then the substrate is taken from the first buffer part 241 and transferred to the coating unit 210 by the coating robot R21. The substrate is coated and heat treated in the coating unit 210. After the substrate has been processed in the coating unit 210, the substrate is taken out of the coating unit 210 and transferred to the second buffer part 251 by the coating robot R21, and then the substrate is taken out of the second buffer part 251 and transferred to the mobile conveying part 230 by the side robot R0. The substrate is transferred to the interface station 300 by the mobile conveying part 230. The substrate is taken out of the mobile conveying part 230 and sent to the exposure machine for exposure processing by the interface robot R30 located in the interface station 300.

FIG. 8b shows the transfer method of substrate in the coating and developing device after exposure processing in Embodiment 1. After the substrate has completed of exposure processing, the interface robot R30 receives the substrate from the exposure machine and transfers the substrate to the third buffer part 262, and then the developing robot R22 takes the substrate out of the third buffer part 262 and transfers the substrate to the developing unit 220. The substrate is developed and heat treated in the developing unit 220, and then the substrate is taken out of the developing unit 220 and transferred to the second buffer part 252 by the developing robot R22 when the substrate has been processed in the developing unit 220. The substrate is taken out of the second buffer part 252 and transferred to the mobile conveying part 230 by the side robot R0, and then the substrate is transferred to the EFEM 100 by the mobile conveying part 230. The substrate is taken out from the mobile conveying part 230 and transferred to the substrate cassette 120 located at the loading port 110 by the EFEM robot R10 located in the EFEM 100.

Embodiment 2

Figure 9:
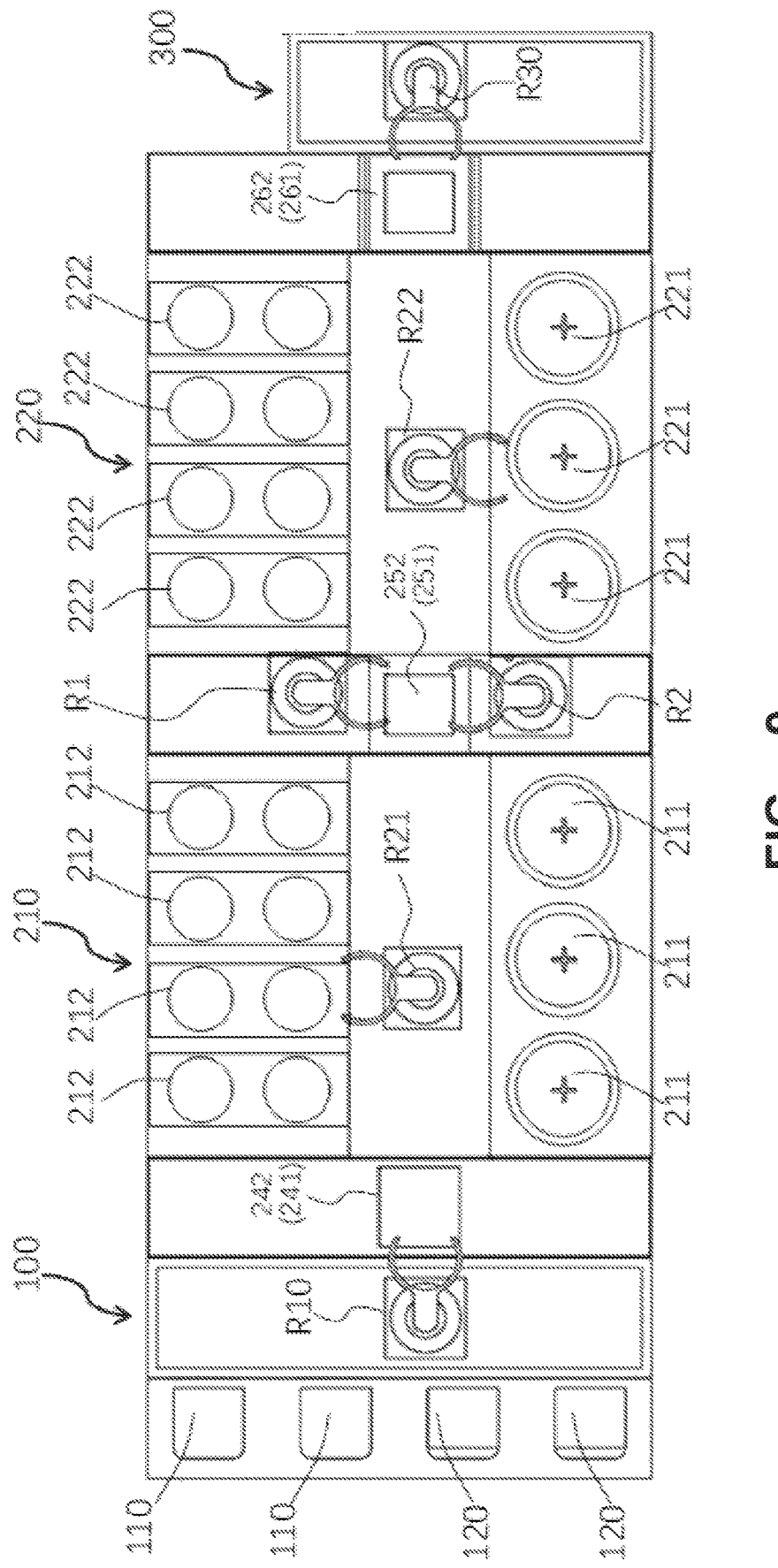
FIG. 9 illustrates a cross-sectional view of a coating and developing device of Embodiment 2 of the present invention.
Figure 10:
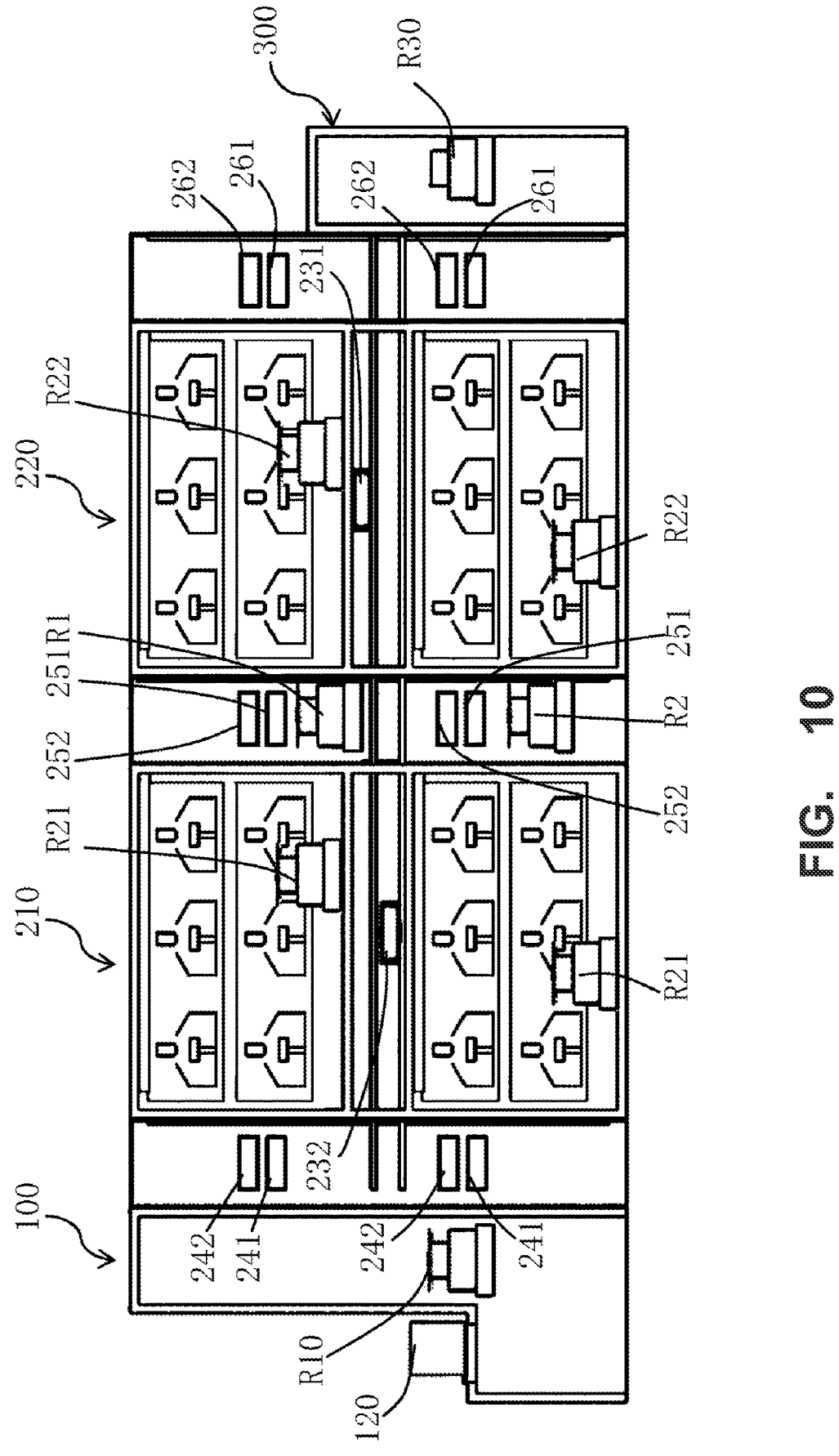
FIG. 10 illustrates a longitudinally cross-sectional view of the coating and developing device of Embodiment 2 of the present invention.
Figure 11:
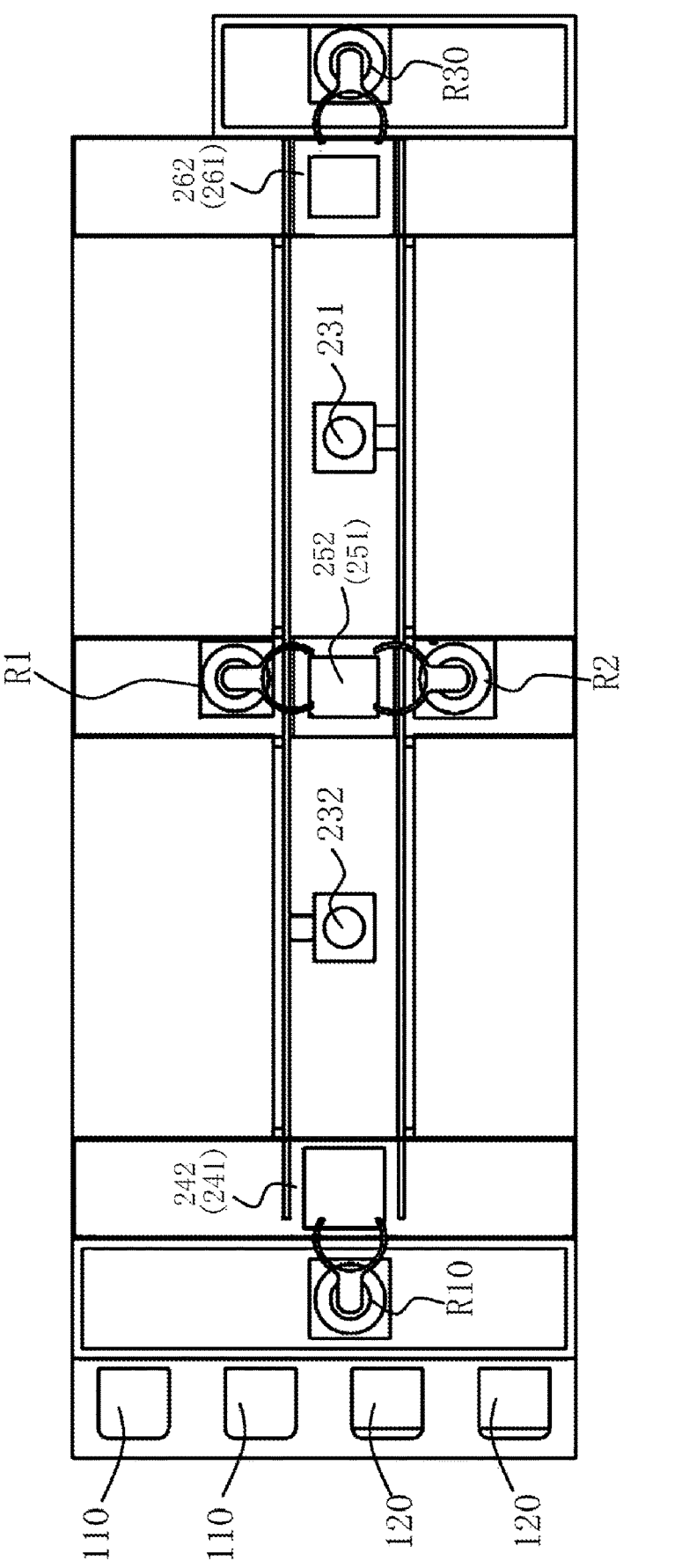
FIG. 11 illustrates another cross-sectional view of the coating and developing device of Embodiment 2 of the present invention.

Referring to FIG. 9 to FIG. 11, the difference between Embodiment 2 and Embodiment 1 is that: 1) two side robots are configured between the coating unit 210 and the developing unit 220, namely the first side robot R1 and the second side robot R2; 2) A pair of mobile conveying parts are installed between the top and bottom of the coating unit 210 and the developing unit 220, namely the first mobile conveying part 231 and the second mobile conveying part 232. The first side robot R1 is used to transfer the substrate to the first mobile conveying part 231 after the substrate has been processed in the coating unit 210. The second side robot R2 is used to transfer the substrate having been processed in the developing unit 220 to the second mobile conveying part 232. The other structures of the coating and developing device proposed in Embodiment 2 are substantially the same as in Embodiment 1 and will not be described below.

Figures 12A, 12B:
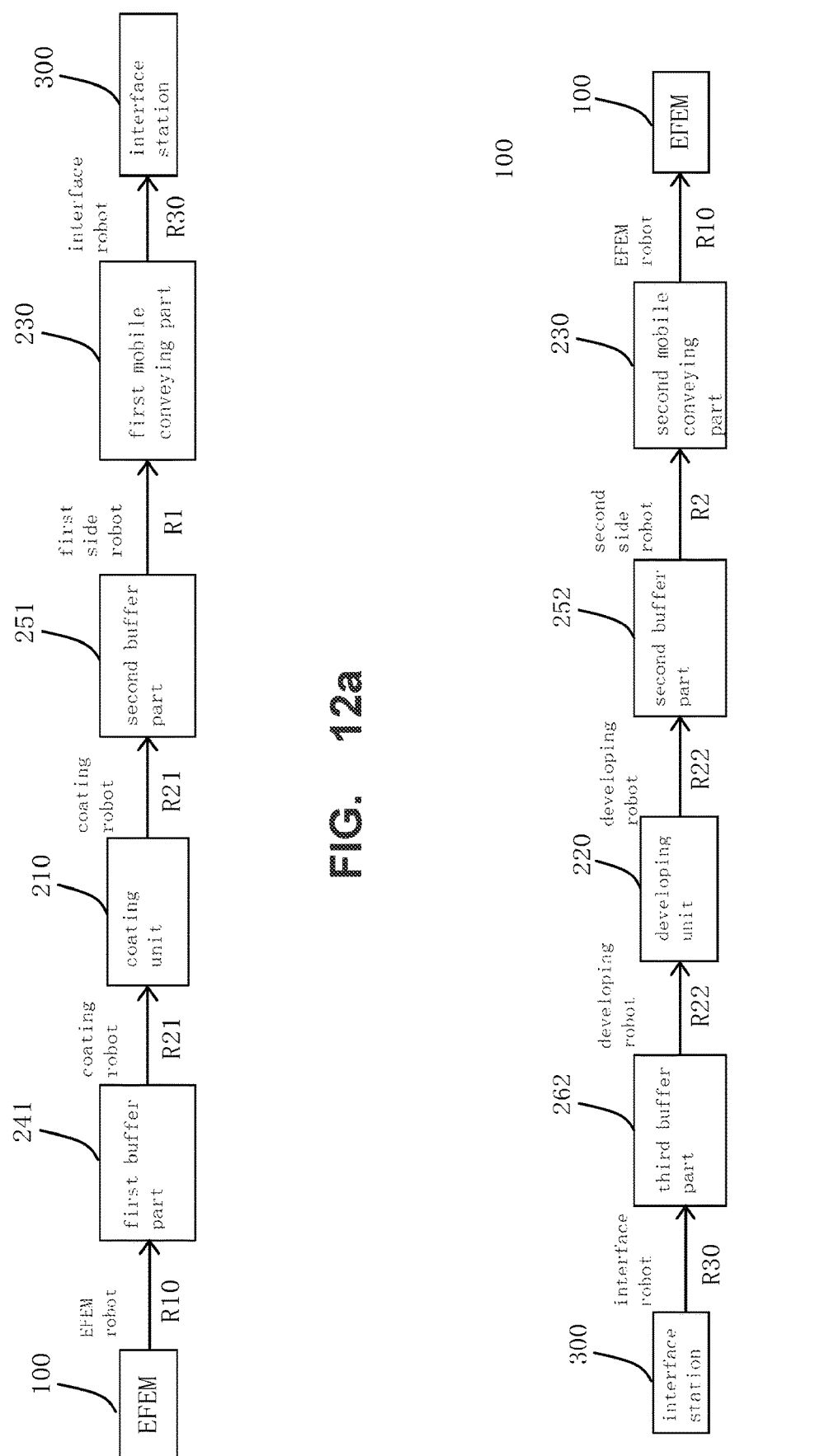
FIG. 12*a* illustrates the transport path of the substrate in the coating and developing device before exposure processing in Embodiment 2 of the present invention.
FIG. 12*b* illustrates the transport path of the substrate in the coating and developing device after exposure processing in Embodiment 2 of the present invention.

FIG. 12a shows the transfer method of substrate in the coating and developing device prior to exposure processing in Embodiment 2. The substrate to be processed is taken from the EFEM 100 and transferred to the first buffer part 241 by the EFEM robot R10, and then the substrate is taken from the first buffer part 241 and transferred to the coating unit 210 by the coating robot R21. The substrate is coated and heat treated in the coating unit 210, and then the substrate is taken out of the coating unit 210 and transferred to the second buffer part 251 by the coating robot R21 when the substrate has been processed in the coating unit 210. The substrate is taken out of the second buffer part 251 and transferred to the first mobile conveying part 231 by the first side robot R1, and then the first mobile conveying part 231 transfers the substrate to the interface station 300. The substrate is taken out of the first mobile conveying part 231 and sent to the exposure machine for exposure processing by the interface robot R30 located in the interface station 300.

FIG. 12b shows the transfer method of the substrate in the coating and developing device after exposure processing in Embodiment 2. After the substrate has completed of exposure processing, the interface robot R30 receives the substrate from the exposure machine and transfers the substrate to the third buffer part 262, and then the developing robot R22 takes the substrate out of the third buffer part 262 and transfers the substrate to the developing unit 220. The substrate is developed and heat treated in the developing unit 220. The developing robot R22 takes the substrate out of the developing unit 220 and transfers the substrate to the second buffer part 252 when the substrate has been processed in the developing unit 220, and then the substrate is taken out of the second buffer part 252 and transferred to the second mobile conveying part 232 by the second side robot R2. The second mobile conveying part 232 transfers the substrate to the EFEM 100, and then the substrate is taken out of the second mobile conveying part 232 and transferred to the substrate cassette 120 located at the loading port 110 by the EFEM robot R10 located in EFEM.

Without changing the footprint of the device, two side robots and a pair of mobile conveying parts are set up so that the substrate transfer paths after the substrate has been processed in the coating unit and the developing unit are not overlapping, which can avoid cross-contamination caused by sharing the side robot and the mobile conveying part, and can improve the transfer efficiency of the device.

Embodiment 3

Figure 13:
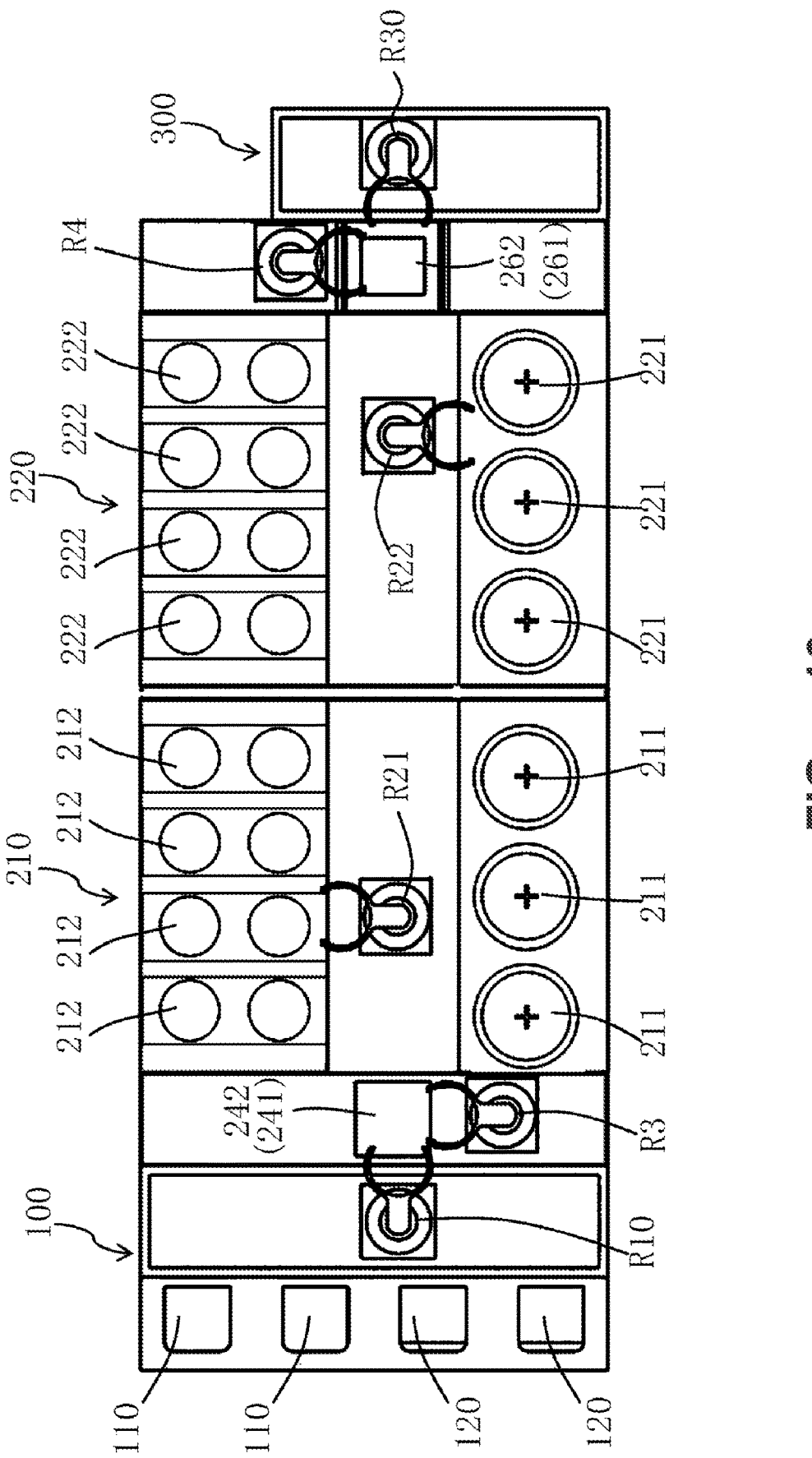
FIG. 13 illustrates a cross-sectional view of a coating and developing device of Embodiment 3 of the present invention.
Figure 14:
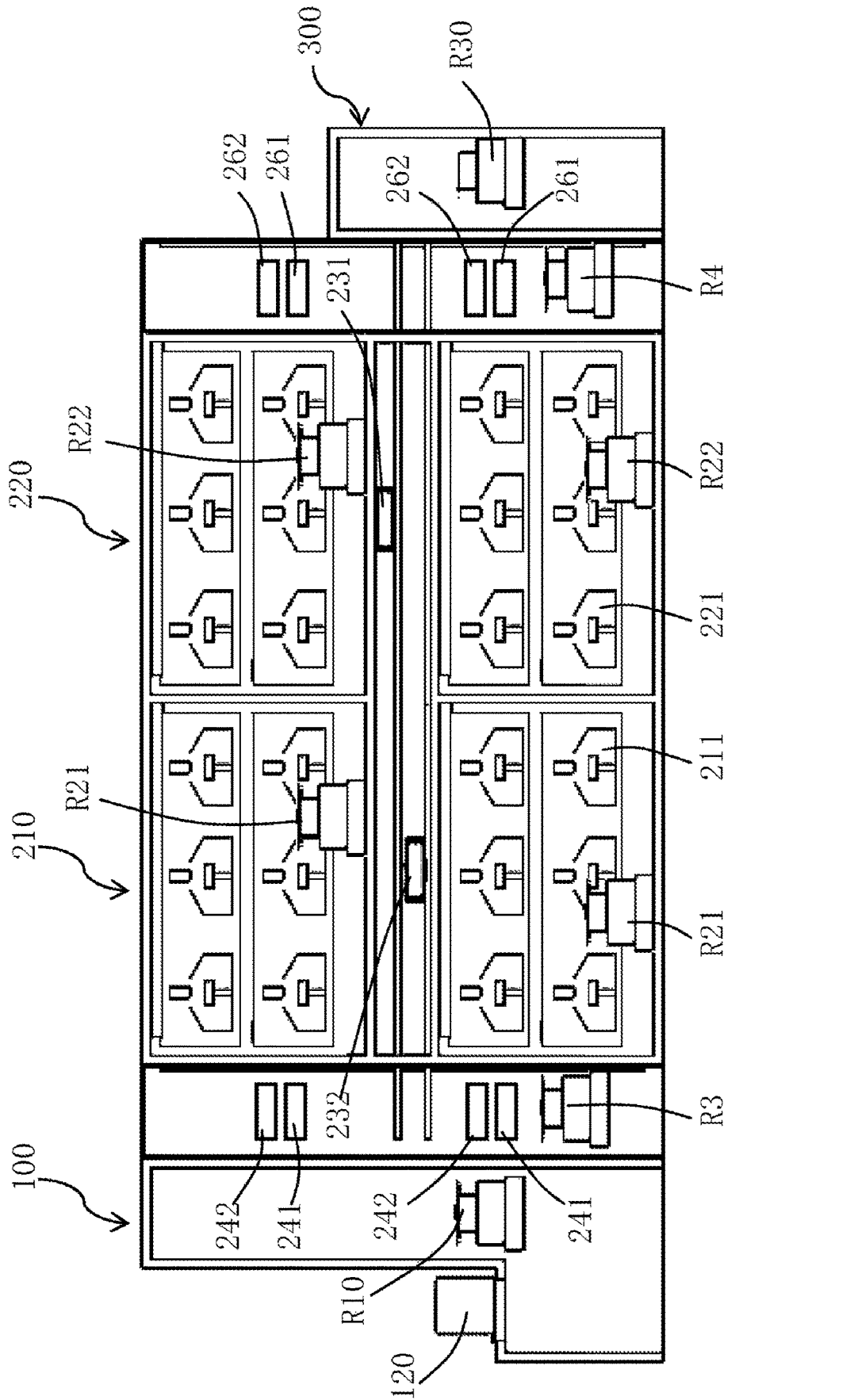
FIG. 14 illustrates a longitudinally cross-sectional view of the coating and developing device of Embodiment 3 of the present invention.
Figure 15:
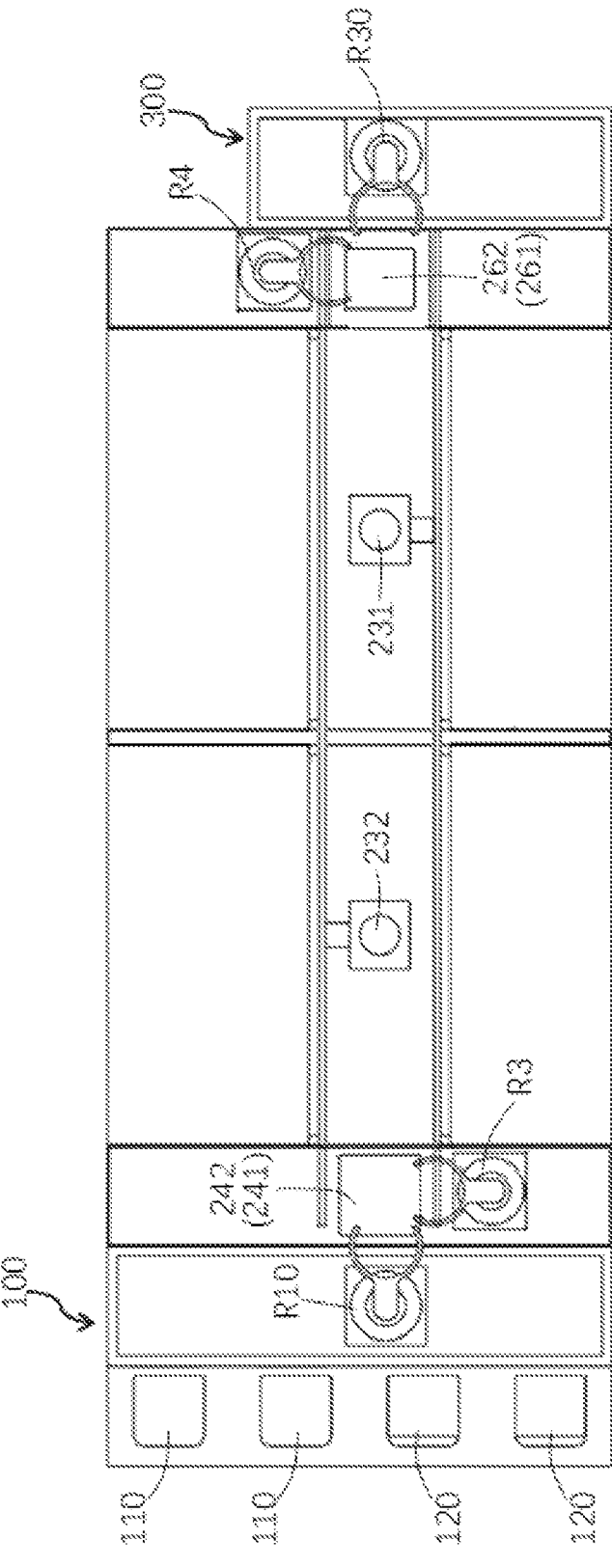
FIG. 15 illustrates another cross-sectional view of the coating and developing device of Embodiment 3 of the present invention.

Referring to FIG. 13 to FIG. 15, the difference between Embodiment 3 and Embodiment 1 is that: 1) the side robot R0 and the second buffer part (251,252) are not installed between the coating unit 210 and the developing unit 220, instead, a side robot is installed between the EFEM 100 and the coating unit 210 and another side robot is installed between the developing unit 220 and the interface station 300, defined as the third side robot R3 and the fourth side robot R4 respectively; 2) A pair of mobile conveying parts are installed between the top and bottom of the coating unit 210 and the developing unit 220, namely the first mobile conveying part 231 and the second mobile conveying part 232 respectively. The third side robot R3 is used to transfer the substrate to the first mobile conveying part 231 after the substrate has been processed in the coating unit 210, or to take the substrate from the second mobile conveying part 232 after the substrate has been processed in the developing unit 220. The fourth side robot R4 is used to transfer the substrate to the second mobile conveying part 232 after the substrate has been processed in the developing unit 220, or to take the substrate from the first mobile conveying part 231 after the substrate has been processed in the coating unit 210. The other structures of the coating and developing device proposed in Embodiment 3 are substantially the same as in Embodiment 1 and will not be described below.

In Embodiment 3, the removal of the side robot between the coating unit 210 and the developing unit 220 can shorten the length of the coating and developing device and reduce the footprint of the device, at the same time, the motion travel of the mobile conveying part can be shortened to improve its transfer efficiency, thus improving the operation efficiency of the entire device.

Figure 16A:
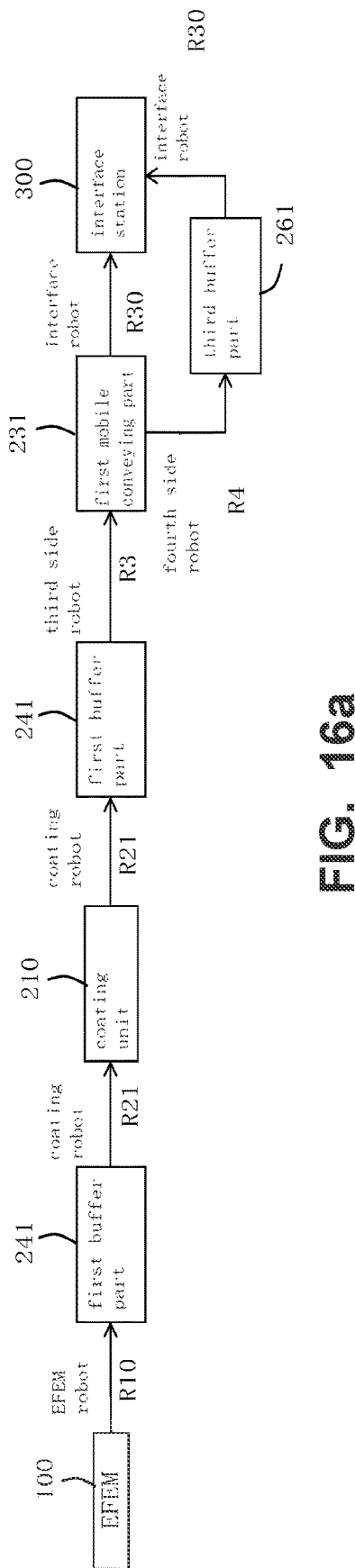
FIG. 16*a* illustrates the transport path of the substrate in the coating and developing device before exposure processing in Embodiment 3 of the present invention.

FIG. 16a shows the transfer method of substrate in the coating and developing device prior to exposure processing in Embodiment 3. The substrate to be processed is taken from the front end module 100 and transferred to the first buffer part 241 by the EFEM robot R10, and then the substrate is taken from the first buffer part 241 and transferred to the coating unit 210 by the coating robot R21. The substrate is coated and heat treated in the coating unit 210, and then the substrate is taken out of the coating unit 210 and transferred to the first buffer part 241 by the coating robot R21 when the substrate has been processed in the coating unit 210. The substrate is taken out of the first buffer part 241 and transferred to the first mobile conveying part 231 by the third side robot R3, and then the first mobile conveying part 231 transfers the substrate to the interface station 300. The substrate is directly taken out of the first mobile conveying part 231 and sent to the exposure machine for exposure processing by the interface robot R30 located in the interface station 300, or the substrate is taken out of the first mobile conveying part 231 and transferred to the third buffer part 261 by the fourth side robot R4, then the substrate is taken out of the third buffer part 261 and sent to the exposure machine for exposure processing by the interface robot R30.

Figure 16B:
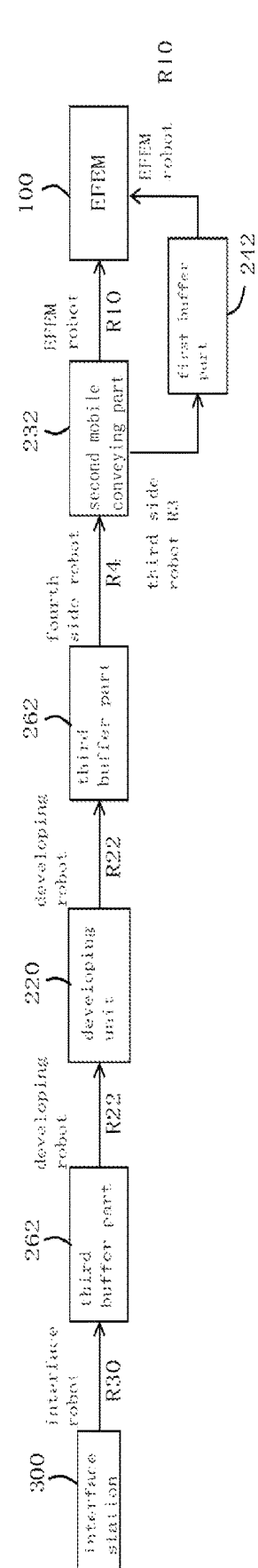
FIG. 16*b* illustrates the transport path of the substrate in the coating and developing device after exposure processing in Embodiment 3 of the present invention.

FIG. 16b shows the transfer method of substrate in the coating and developing device after the exposure processing of Embodiment 3. After the substrate has completed of exposure processing, the interface robot R30 receives the substrate from the exposure machine and transfers the substrate to the third buffer part 262. The substrate is taken out of the third buffer part 262 and transferred to the developing unit 220 by the developing robot R22. The substrate is developed and heat treated in the developing unit 220, and then the substrate is taken out of the developing unit 220 and transferred to the third buffer part 262 by the developing robot 220. The substrate is taken out of the third buffer part 262 and transferred to the second mobile conveying part 232 by the fourth side robot R4, and then the substrate is transferred to the EFEM 100 by the second mobile conveying part 232. The substrate is taken directly out of the second mobile conveying part 232 and transferred to the substrate cassette 120 located at the loading port 110 by the EFEM robot R10 located in EFEM, or the substrate is taken out of the second mobile conveying part 232 and transferred to the first buffer part 242 by the third side robot R3, and then the substrate is taken from the first buffer part 242 and transferred to the substrate cassette 120 located at the loading port 110 by the EFEM robot R10.

Embodiment 4

Figure 17:
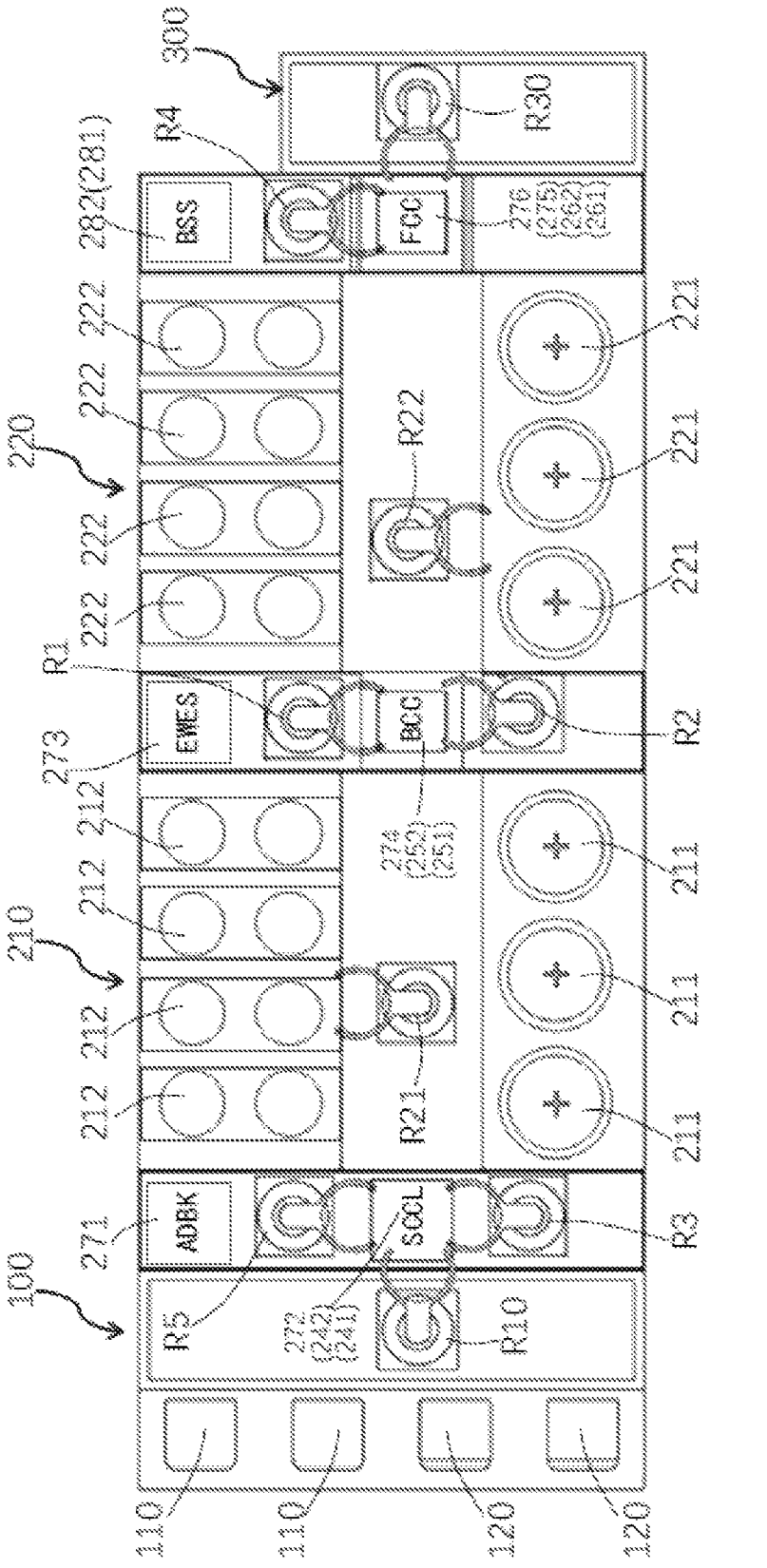
FIG. 17 illustrates a cross-sectional view of a coating and developing device of Embodiment 4 of the present invention.
Figure 18:
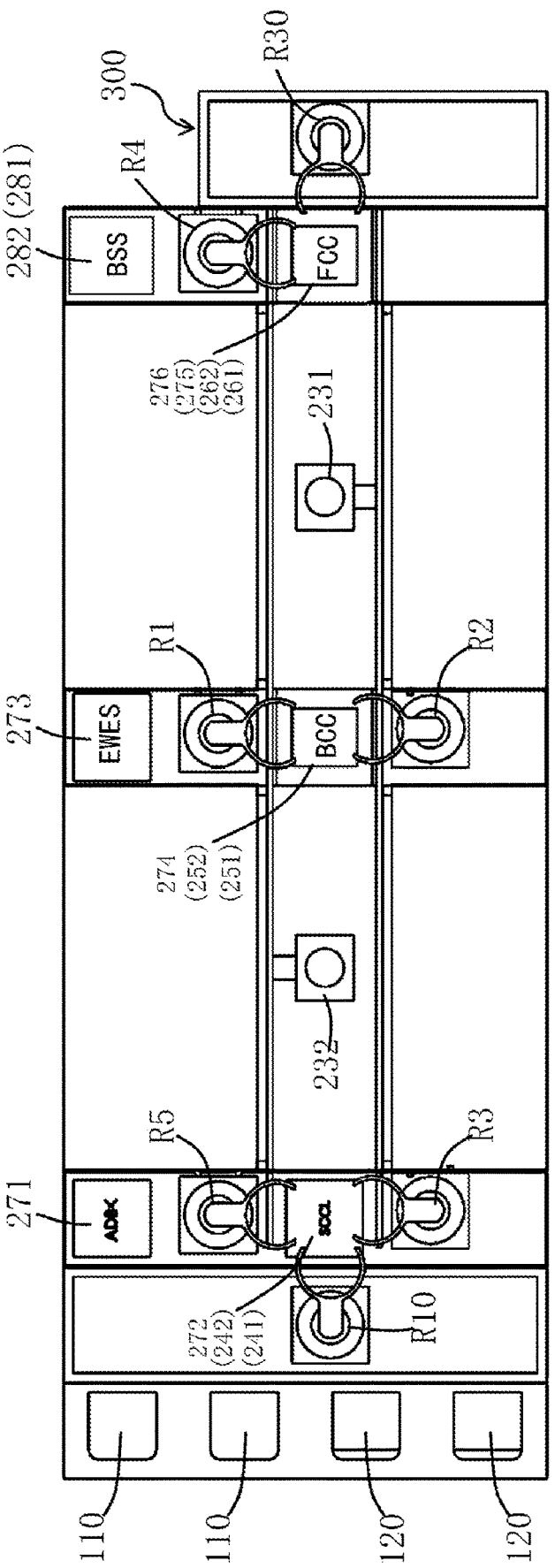
FIG. 18 illustrates another cross-sectional view of the coating and developing device of Embodiment 4 of the present invention.
Figure 19:
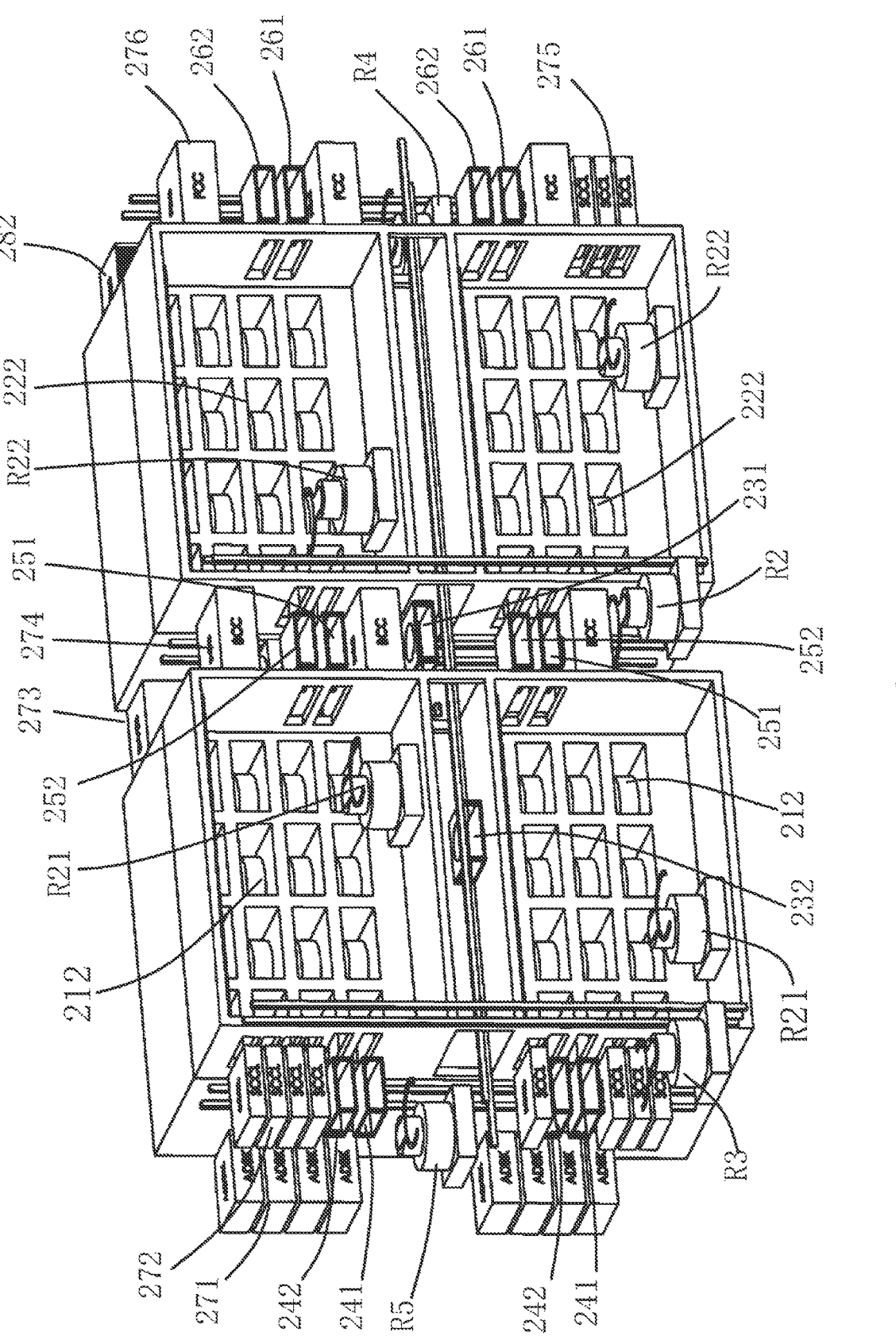
FIG. 19 illustrates a perspective view of a process station hiding coating modules and developing modules in the coating and developing device of Embodiment 4 of the present invention.

Referring to FIG. 17 to FIG. 19, the difference between Embodiment 4 and Embodiment 1 is that: 1) two side robots are configured between the coating unit 210 and the developing unit 220, namely the first side robot R1 and the second side robot R2; and two side robots are configured between the EFEM 100 and the coating unit 210, namely the third side robot R3 and the fifth side robot R5; a side robot is configured between the developing unit 220 and the interface station 300, namely the fourth side robot R4, the operation flow of multiple side robots will be described in detail in the following paragraphs with the transfer process of the substrate; 2) a pair of mobile conveying parts are installed between the top and bottom of the coating unit 210 and the developing unit 220, namely the first mobile conveying part 231 and the second mobile conveying part 232 respectively, the first side robot R1 is used to transfer the substrate to the first mobile conveying part 231 after the substrate has been processed in the coating unit 210, the second side robot R2 is used to transfer the substrate to the second mobile conveying part 232 after the substrate has been processed in the developing unit 220, the third side robot R3 is used to take the substrate from the second mobile conveying part 232 after the substrate has been processed in developing unit 220, and the fourth side robot R4 is used to take the substrate from the first mobile conveying part 231 after the substrate has been processed in the coating unit 210; 3) multiple functional modules, the specific layout and function of the functional modules will be described in detail in the following. The other structures of the coating and developing device proposed in Embodiment 4 are substantially the same as in Embodiment 1 and will not be described below.

Functional modules include adhesion modules 271, pre cooling modules 272, edge exposure modules 273, pre cleaning modules 274, post cooling modules 275 and post cleaning modules 276.

In this embodiment, a plurality of vertically stacked adhesion modules 271 and a plurality of vertically stacked pre cooling modules 272 are arranged between the EFEM 100 and the coating unit 210. The adhesion modules 271 are used to form adhesive film on the substrate surface before the substrate is sent to the coating unit 210 for treatment, for example, HMDS gas is used to blow the substrate surface to improve the hydrophobicity of the substrate surface, which is conducive to enhancing the adhesion between the photoresist and the substrate. The substrate temperature after adhesion treatment is at a high temperature of 120° C.~130° C. The substrate is transferred from the adhesion module 271 to the pre cooling module 272 by the fifth side robot R5, and the substrate is cooled from high temperature to 22° C.~23° C.

A plurality of vertically stacked edge exposure modules 273 are arranged between the coating unit 210 and the developing unit 220 for edge exposure processing the substrate which has been processed in the coating unit. If the interface station 300 is connected to an immersion exposure machine, it is generally necessary to perform a precleaning operation on the substrate before the substrate is transferred to the exposure machine for immersion exposure operation to reduce the defocusing phenomenon during exposure processing. Therefore, in the embodiment, a plurality of vertically stacked pre cleaning modules 274 are arranged between the coating unit 210 and the developing unit 220 for cleaning the substrate after edge exposure processing.

A plurality of post cooling modules 275 are arranged between the developing unit 220 and the interface station 300 for cooling the substrate after precleaning. In addition, for the substrate after immersion exposure processing, the substrate needs to be cleaned before entering the developing unit 220 for processing to avoid damage to the photoresist when the immersion liquid remaining on the surface of the substrate after immersion exposure processing is heated. Therefore, in the embodiment, a plurality of vertically stacked post cleaning modules 276 are arranged between the developing unit 220 and the interface station 300 for cleaning the substrate after immersion exposure processing.

Figures 20A, 20B:
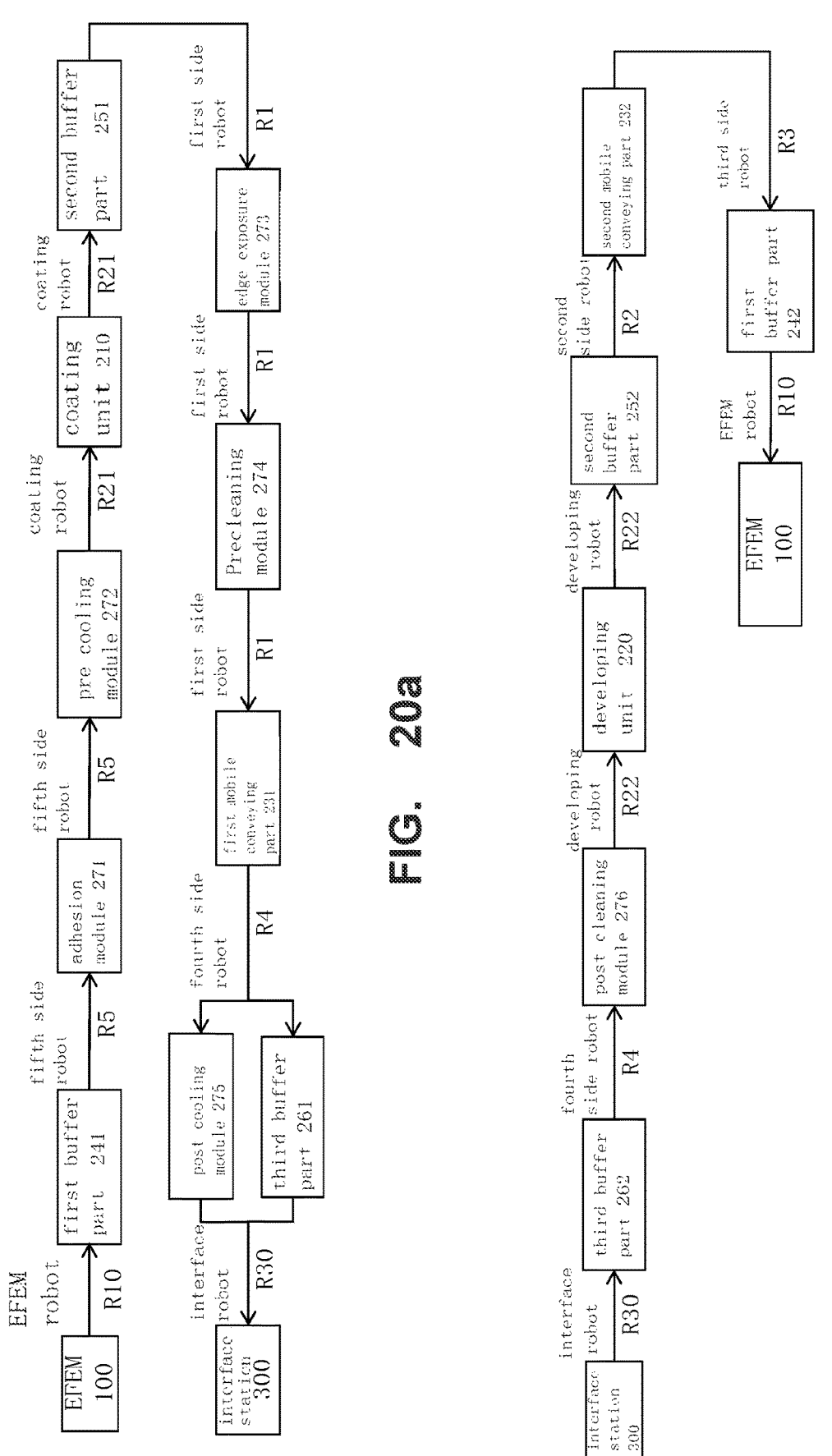
FIG. 20*a* illustrates the transport path of the substrate in the coating and developing device before exposure processing in Embodiment 4 of the present invention.
FIG. 20*b* illustrates the transport path of the substrate in the coating and developing device after exposure processing in Embodiment 4 of the present invention.

FIG. 20a shows the transfer method of substrate in the coating and developing device prior to exposure processing in Embodiment 4. EFEM robot R10 transfers the substrate to be processed to the first buffer part 241, the fifth side robot R5 takes the substrate out of the first buffer part 241 and transfers the substrate to the adhesion module 271, and then transfers the substrate to the pre cooling module 272 after the substrate is finished adhesion treatment. The coating robot R21 takes the substrate out of the pre cooling module 272 and transfers the substrate to the coating unit 210, and the substrate is coated and heat treated in the coating unit 210, and then the coating robot R21 transfers the substrate to the second buffer part 251 after the substrate is processed in the coating unit 210. The first side robot R1 takes the substrate from the second buffer part 251 and transfers the substrate to the edge exposure module 273, and then transfers the substrate after edge exposure processing to the pre cleaning module 274 for precleaning, and then transfers the precleaned substrate to the first mobile conveying part 231. The first mobile conveying part 231 transfers the substrate to the interface station 300. The fourth side robot R4 takes the substrate out of the first mobile conveying part 232 and transfers the substrate to the third buffer part 261 or the post cooling module 275. The interface robot R30 takes the substrate out of the third buffer part 261 or the post cooling module 275 and transfers the substrate to the exposure machine for exposure processing.

FIG. 20b shows the transfer method of substrate in the coating and developing device after exposure processing in this embodiment. The interface robot R30 receives the exposed substrate from the exposure machine and transfers the substrate to the third buffer part 262. The fourth side robot R4 takes the substrate from the third buffer part 262 and transfers the substrate to the post cleaning module 276 for exposure post cleaning, and then transfers the cleaned substrate to the third buffer part 262. The developing robot R22 takes the substrate from the third buffer part 262 and transfers the substrate to the developing unit 220. The substrate is developed and heat treated in the developing unit 220, and then the developing robot R22 transfers the substrate after processing in the developing unit to the second buffer part 252. The second side robot R2 takes the substrate out of the second buffer part 252 and transfers the substrate to the second mobile conveying part 232. The second mobile conveying part 232 transfers the substrate to the EFEM 100. The third side robot R3 takes the substrate out of the second mobile conveying part 232 and transfers the substrate to the first buffer part 242. The EFEM robot R10 takes the substrate from the first buffer part 242 and transfers the substrate to the substrate cassette 120 located at the loading port 110.

In Embodiment 4, comparing with Embodiment 1, it may also include two temporary storage parts, namely first temporary storage part 281 and second temporary storage part 282, which are stacked and installed between the developing unit 220 and the interface station 300. The first temporary storage part 281 is used to temporarily store the substrate which has been processed in the coating unit 210, so as to wait for entering the exposure machine for exposure processing. When there is a free station in the exposure machine, the substrate is preferentially obtained from the first temporary storage part 281 and transferred to the exposure machine for exposure processing, in this way, the substrate which has been processed in the coating unit 210 can be temporarily stored before entering into the exposure machine, so that the substrate waiting to enter the exposure machine for exposure processing is sufficient, thus reducing the waiting time of the exposure machine and improving the efficiency of the exposure machine.

The second temporary storage part 282 is used to temporarily store the substrate after exposure processing, so as to wait for entering the developing unit for processing. When there is an idle station in the developing unit, the substrate is preferentially obtained from the second temporary storage part 282 and transferred to the developing unit for processing, so that the substrate which has been exposure processed can be temporarily stored before entering into the developing unit 220, so that the substrate that completes the exposure processing in the exposure machine is sent out in time, thereby reducing the occupation or waiting time of the exposure machine and improving the use efficiency of the exposure machine.

Embodiment 5

Figure 21:
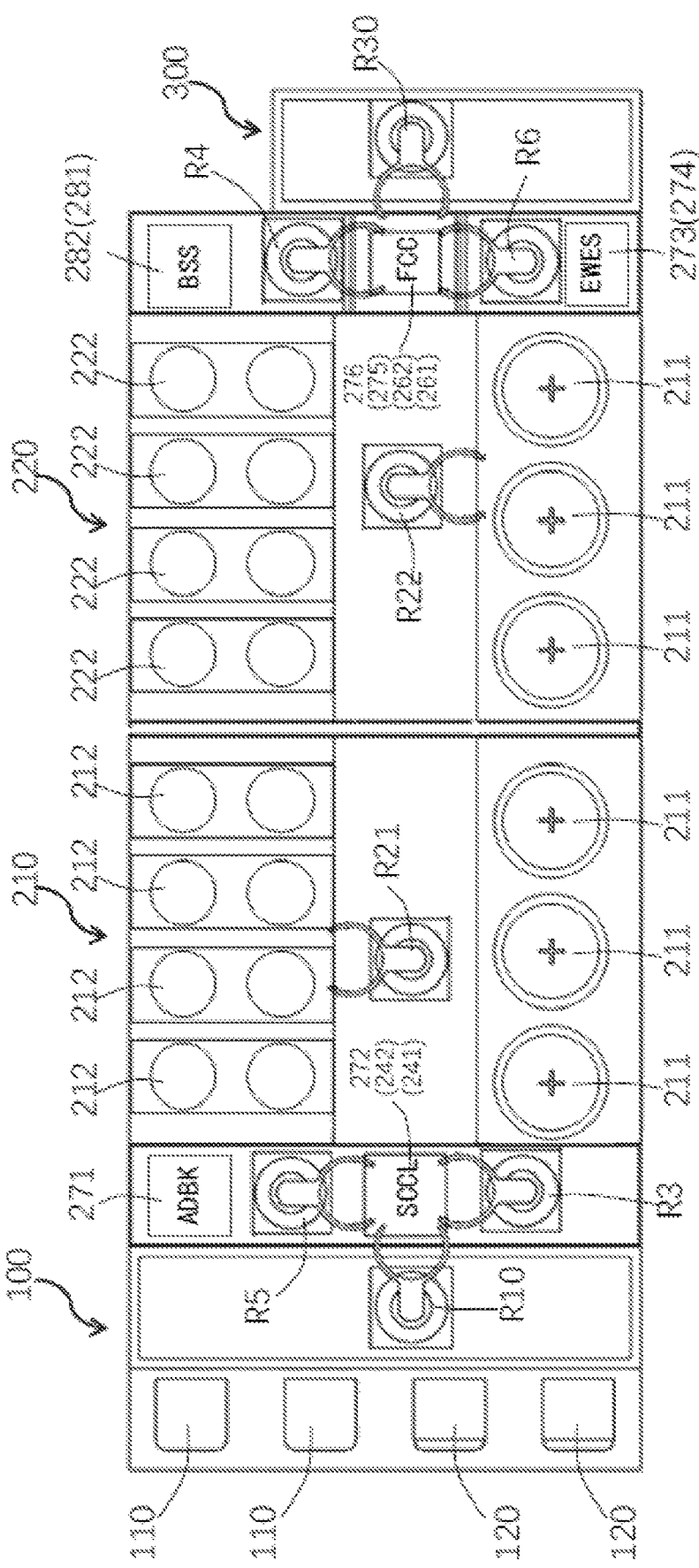
FIG. 21 illustrates a cross-sectional view of a coating and developing device of Embodiment 5 of the present invention.
Figure 22:
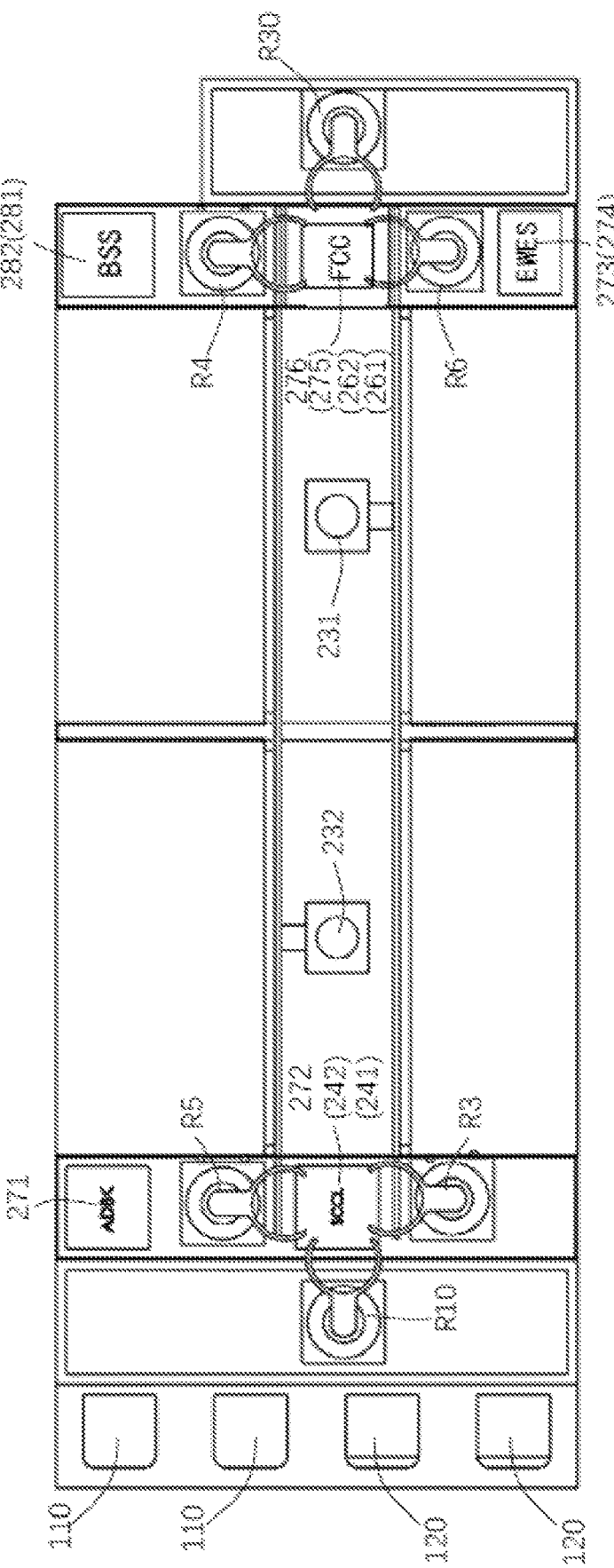
FIG. 22 illustrates another cross-sectional view of the coating and developing device of Embodiment 5 of the present invention.

Referring to FIG. 21 and FIG. 22, the difference between Embodiment 5 and Embodiment 1 is that: 1) the side robot R0 and the second buffer part (251,252) are not installed between the coating unit 210 and the developing unit 220, but two side robots are installed between the EFEM 100 and the coating unit 210, namely the third side robot R3 and the fifth side robot R5, and two side robots are installed between the developing unit 220 and the interface station 300, namely the fourth side robot R4 and the sixth side robot R6 respectively, the operation flow of the multiple side robots will be described in detail in the following paragraphs with the transfer process of the substrate; 2) a pair of mobile conveying parts are installed between the top and bottom of the coating unit 210 and the developing unit 220, namely the first mobile conveying part 231 and the second mobile conveying part 232, the fifth side robot R5 is used to transfer the substrate to the first mobile conveying part 231 after the substrate is processed in the coating unit 210, the sixth side robot R6 is used to take out the substrate after completion of processing in the coating unit 210 from the first mobile conveying part 231, the fourth side robot R4 is used to transfer the substrate after completion of processing in the developing unit 220 to the second mobile conveying part 232, and the third side robot R3 is used to take out the substrate from the second mobile conveying part 232 after the substrate is processed in the developing unit 220; 3) multiple functional modules, the specific layout and function of the functional modules will be described in detail in the following. The other structures of the coating and developing device proposed in Embodiment 5 are substantially the same as in Embodiment 1 and will not be described below.

The functional modules include adhesion modules 271, pre cooling modules 272, edge exposure modules 273, pre cleaning modules 274, post cooling modules 275 and post cleaning modules 276, and the functions of each functional module are the same as those of Embodiment 4. In this embodiment, a plurality of vertically stacked adhesion modules 271 and a plurality of vertically stacked pre cooling modules 272 are arranged between the EFEM 100 and the coating unit 210. A plurality of vertically stacked edge exposure modules 273, a plurality of vertically stacked pre cleaning modules 274, a plurality of vertically stacked post cooling modules 275 and a plurality of vertically stacked post cleaning modules 276 are arranged between the developing unit 220 and the interface station 300. In other embodiments, a plurality of vertically stacked edge exposure modules 273 and a plurality of vertically stacked pre cleaning modules 274 can also be arranged between the EFEM 100 and the coating unit 210.

Figures 23A, 23B:
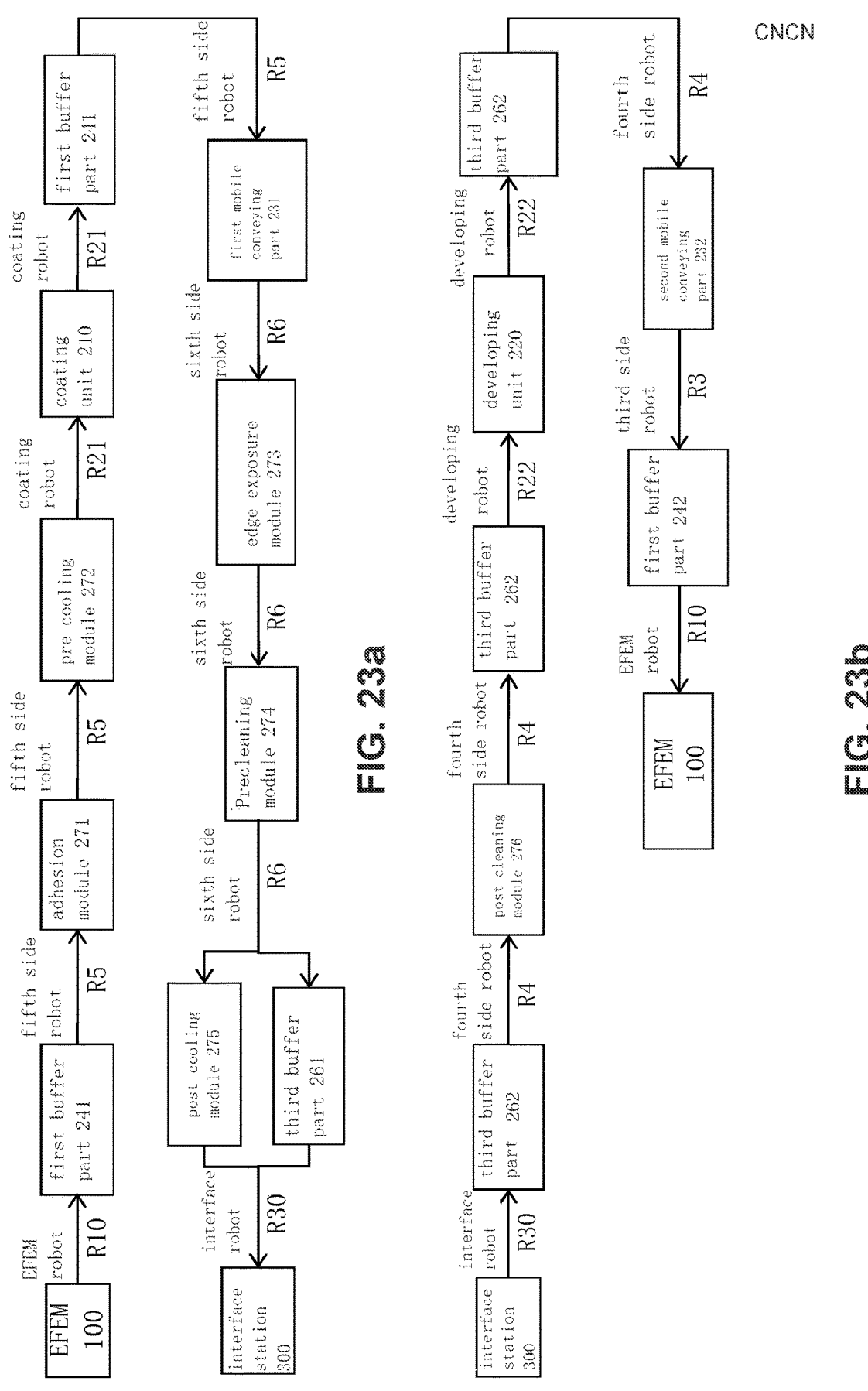
FIG. 23*a* illustrates the transport path of the substrate in the coating and developing device before exposure processing in Embodiment 5 of the present invention.
FIG. 23*b* illustrates the transport path of the substrate in the coating and developing device after exposure processing in Embodiment 5 of the present invention.

FIG. 23*a* shows the transfer method of substrate in the coating and developing device prior to exposure processing in Embodiment 5. The EFEM robot R10 transfers the substrate to be processed to the first buffer part 241. The fifth side robot R5 takes the substrate out of the first buffer part 241 and transfers the substrate to the adhesion module 271, and then transfers the substrate to the pre cooling module 272 after the substrate is finished adhesion treatment. The coating robot R21 takes the substrate out of the pre cooling module 272 and transfers the substrate to the coating unit 210, and the substrate is coated and heat treated in the coating unit 210, and then the coating robot R21 transfers the substrate having been processed in the coating unit 210 to the first buffer part 241. The fifth side robot R5 takes the substrate from the first buffer part 241 and transfers the substrate to the first mobile conveying part 231. The first mobile conveying part 231 transfers the substrate to the interface station 300. The sixth side robot R6 takes the substrate out of the first mobile conveying part 231 and transfers the substrate to the edge exposure module 273, then transfers the edge exposure treated substrate to the pre cleaning module 274 for precleaning, and then transfers the precleaned substrate to the third buffer part 261 or the post cooling module 275. The interface robot R30 takes the substrate out of the third buffer part 261 or the post cooling module 275 and transfers the substrate to the exposure machine for exposure processing.

FIG. 23*b* shows the transfer method of substrate in the coating and developing device after exposure processing in Embodiment 5. The interface robot R30 receives the substrate from the exposure machine after the substrate is finished exposure processing and transfers the substrate to the third buffer part 262. The fourth side robot R4 takes the substrate from the third buffer part 262 and transfers the substrate to the post cleaning module 276 for exposure post cleaning, and then transfers the substrate to the third buffer part 262 after the substrate is finished cleaning. The developing robot R22 takes the substrate from the third buffer part 262 and transfers the substrate to the developing unit 220, and the substrate is developed and heat treated in the developing unit 220, and then the developing robot R22 transfers the substrate having been processed in the developing unit 220 to the third buffer part 262. The fourth side robot R4 takes the substrate out of the third buffer part 262 and transfers the substrate to the second mobile conveying part 232. The second mobile conveying part 232 transfers the substrate to the EFEM 100. The third side robot R3 takes the substrate out of the second mobile conveying part 232 and transfers the substrate to the first buffer part 242. The EFEM robot R10 takes the substrate from the first buffer part 242 and transfers the substrate to the substrate cassette 120 in the loading port 110.

Similarly, the first temporary storage part 281 and the second temporary storage part 282 can be applied to Embodiment 5.

Embodiment 6

Figure 24:
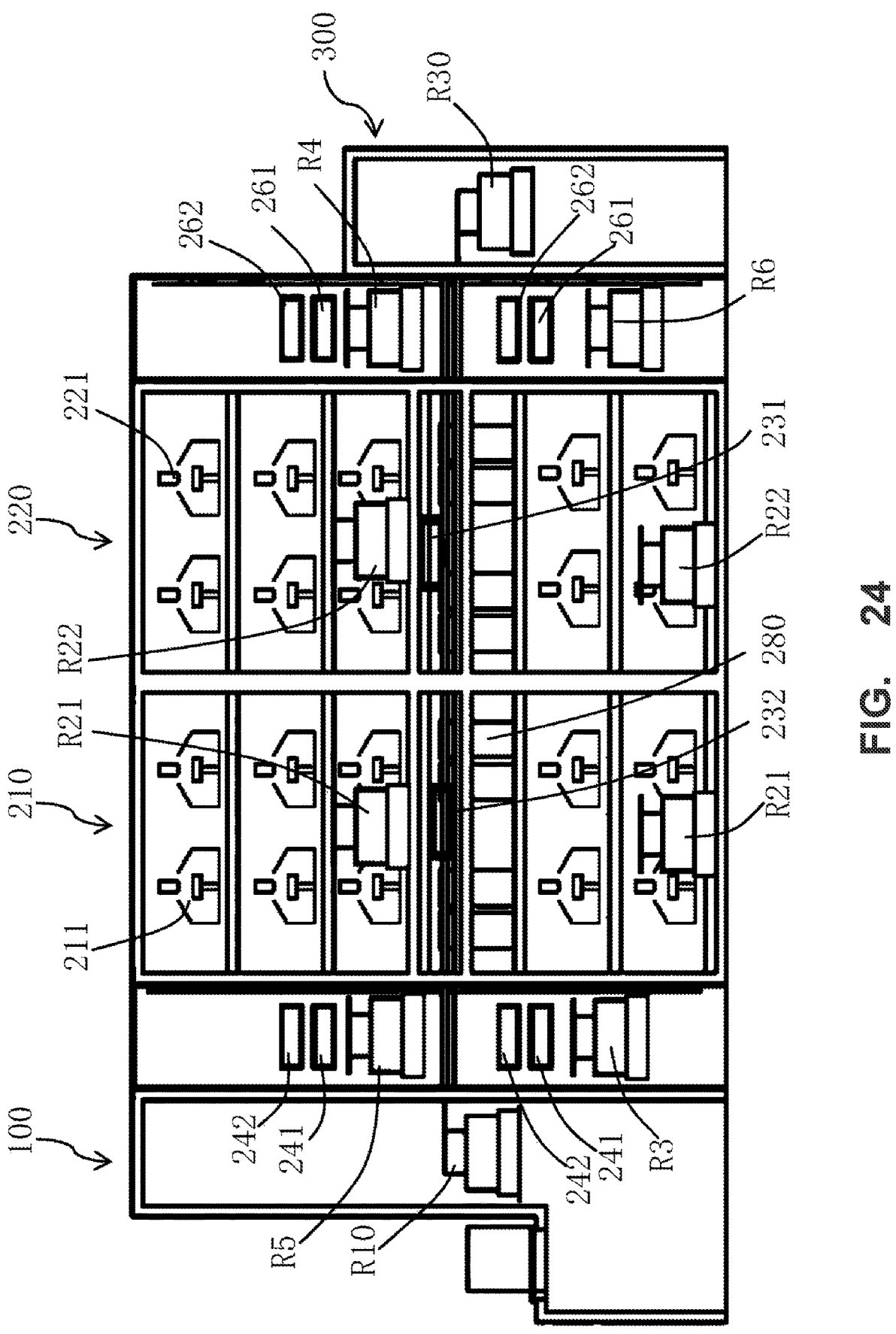
FIG. 24 illustrates a longitudinally cross-sectional view of a coating and developing device of Embodiment 6 of the present invention.

FIG. 24 shows a longitudinally cross-sectional view of a coating and developing device of Embodiment 6. The difference between Embodiment 6 and Embodiments 5 is that:

1) the coating unit 210 has two lines of vertically stacked coating modules 211, each line having five coating modules 211, and the developing unit 220 has two lines of vertically stacked developing modules 221, each line having five developing modules 221; 2) photoresist tanks 280 and photoresist pumps (not shown in the figure) are also integrated in the coating and developing device, photoresist tanks 280 store photoresist, and the photoresist tanks 280 supply the photoresist to the coating modules 211 through the photoresist pumps. The photoresist tanks 280 are disposed at one side of the transfer direction of the mobile conveying part (231,232), and the photoresist pumps are located between the EFEM 100 and the coating unit 210 (not shown). The other structures of the coating and developing device and the numbering of the same components in Embodiment 6 are substantially the same as in Embodiment 5 and will not be described below.

The functional modules in Embodiment 6 are not shown in FIG. 24, and the specific layout and functions of the functional modules in Embodiment 6 can be referred to Embodiment 5.

In other embodiments, the photoresist tanks and the photoresist pumps may also be arranged outside the coating and developing device, for example in an external cabinet.

The coating and developing device and the substrate transfer method of the present invention adopt the vertical layout of the coating modules and the developing modules respectively, and the process atmosphere of the coating and developing are completely independent, which can more easily control the cleanliness of the environmental atmosphere and reduce the risk of substrate particle pollution, meanwhile, the transversely moving of mobile conveying part is cooperated with the vertically moving of side robot to transfer the substrate which has been processed in the coating unit or the developing unit to the interface station or the front end module, so as to improve the operation efficiency of the robot in the coating unit or the developing unit, and thus improve the overall operation efficiency of the device.

The above embodiments are provided to those skilled in the art to realize or use the invention, under the condition that various modifications or changes being made by those skilled in the art without departing the spirit and principle of the invention, the above embodiments may be modified and changed variously, therefore the protection scope of the invention is not limited by the above embodiments, rather, it should conform to the maximum scope of the innovative features mentioned in the Claims.

What is claimed is:

1. A coating and developing device, comprising a front end module, a process station and an interface station successively connected, wherein the process station comprises:

a coating unit, comprising at least one line of vertically stacked coating modules for performing coating treatment to a substrate;

a developing unit, comprising at least one line of vertically stacked developing modules for performing developing treatment to the substrate, wherein the coating unit and the developing unit are arranged in a straight line;

at least one transversally moving of mobile conveying part; and at least one vertically moving of side robot;

wherein after the substrate has been processed in the coating unit, the substrate is transferred to the mobile conveying part by at least one side robot, and the mobile conveying part transfers the substrate to the interface station; after the substrate has been processed in the developing unit, the substrate is transferred to the mobile conveying part by at least one side robot and the mobile conveying part transfers the substrate to the front end module.

2. The coating and developing device according to claim 1, wherein the coating unit further comprises at least one line of vertically stacked heating processing modules, located opposite the coating modules, for heating and cooling the substrate before and after the coating treatment;

the developing unit further comprises at least one line of vertically stacked heating processing modules, located opposite the developing modules, for heating and cooling the substrate before and after the developing treatment.

3. The coating and developing device according to claim 2, wherein at least one mobile conveying part is located on the top or bottom of the coating unit and the developing unit.

4. The coating and developing device according to claim 3, wherein the coating unit further comprises at least one coating robot, for transferring the substrate between the coating modules and the heating processing modules of the coating unit;

the developing unit further comprises at least one developing robot, for transferring the substrate between the developing modules and the heating processing modules of the developing unit.

5. The coating and developing device according to claim 2, wherein at least one mobile conveying part is located between the top and bottom of the coating unit and the developing unit.

6. The coating and developing device according to claim 5, wherein the coating unit comprises at least one coating robot disposed on an upper side of the mobile conveying part located between the top and bottom of the coating unit and the developing unit and at least one coating robot disposed on a lower side of the mobile conveying part located between the top and bottom of the coating unit and the developing unit, for transferring the substrate between the coating modules and the heating processing modules of the coating unit;

the developing unit comprises at least one developing robot disposed on an upper side of the mobile conveying part located between the top and bottom of the coating unit and the developing unit and at least one developing robot disposed on a lower side of the mobile conveying part located between the top and bottom of the coating unit and the developing unit, for transferring the substrate between the developing modules and the heating processing modules of the developing unit.

7. The coating and developing device according to claim 1, wherein at least one side robot is installed between the coating unit and the developing unit, for transferring the substrate to the mobile conveying part after the substrate has been processed in the coating unit, or transferring the substrate to the mobile conveying part after the substrate has been processed in the developing unit.

8. The coating and developing device according to claim 1, wherein the process station comprises at least two side robots, at least one of the at least two side robots disposed between the coating unit and the front end module, for transferring the substrate to the mobile conveying part after the substrate has been processed in the coating unit, or taking the substrate from the mobile conveying part after the substrate has been processed in the developing unit; and at least one of the at least two side robots disposed between the developing unit and the interface station for transferring the substrate to the mobile conveying part after the substrate has been processed in developing unit, or taking the substrate from the mobile conveying part after the substrate has been processed in the coating unit.

9. The coating and developing device according to claim 1, wherein the process station comprises at least three side robots, at least one of the at least three side robots disposed between the coating unit and the front end module, for taking the substrate from the mobile conveying part after the substrate has been processed in the developing unit;

at least one of the at least three side robots disposed between the coating unit and the developing unit, for transferring the substrate to the mobile conveying part after the substrate has been processed in the coating unit, or transferring the substrate to the mobile conveying part after the substrate has been processed in the developing unit; and at least one of the at least three side robots disposed between the developing unit and the interface station, for taking the substrate from the mobile conveying part after the substrate has been processed in the coating unit.

10. The coating and developing device according to claim 1, wherein the front end module comprises a front end module robot, and the front end module robot takes the substrate from the mobile conveying part after the substrate has been processed in the developing unit;

the interface station comprises an interface robot, and the interface robot takes the substrate from the mobile conveying part after the substrate has been processed in the coating unit.

11. The coating and developing device according to claim 1, wherein the process station further comprises:

a plurality of vertically stacked adhesion modules, for forming adhesive film on the substrate surface; and a plurality of vertically stacked pre cooling modules, for cooling the substrate after adhesion treatment;

wherein the plurality of adhesion modules and the plurality of pre cooling modules are located between the coating unit and the front end module;

before the substrate is transferred to the coating unit for processing, at least one side robot transfers the substrate to the adhesion module, and then transfers the substrate to the pre cooling module after the substrate is finished adhesion treatment.

12. The coating and developing device according to claim 1, wherein the process station further comprises:

a plurality of vertically stacked edge exposure modules, for edge exposure processing the substrate which has been processed in the coating unit;

wherein the plurality of edge exposure modules are installed between the coating unit and the developing unit, or installed between the coating unit and the front end module, or installed between the developing unit and interface station;

at least one side robot transfers the substrate to the edge exposure module for edge exposure processing after the substrate has been processed in the coating unit and before the substrate is transferred to the interface station.

13. The coating and developing device according to claim 12, wherein the process station further comprises:

a plurality of vertically stacked pre cleaning modules, for cleaning the substrate after edge exposure processing;

wherein the plurality of pre cleaning modules are installed between the coating unit and the developing unit, or installed between the coating unit and the front end module, or installed between the developing unit and the interface station;

at least one side robot transfers the substrate to the pre cleaning module for precleaning after the substrate has been processed in the edge exposure module and before the substrate is transferred to the interface station.

14. The coating and developing device according to claim 13, wherein the process station further comprises:

a plurality of vertically stacked post cooling modules, for cooling the substrate after precleaning;

wherein the plurality of post cooling modules are installed between the developing unit and the interface station;

at least one side robot transfers the substrate to the post cooling modules for cooling after the substrate has been precleaned and before the substrate is transferred to the interface station.

15. The coating and developing device according to claim 1, wherein the process station further comprises:

a plurality of vertically stacked post cleaning modules, for post cleaning the substrate after immersion exposure processing and before the substrate is transferred to the developing unit;

wherein the plurality of post cleaning modules are installed between the developing unit and the interface station;

at least one side robot transfers the substrate to the post cleaning module for cleaning after the substrate has been exposure processed, and transfers the substrate to the developing unit for developing processing after the substrate has been post cleaned.

16. The coating and developing device according to claim 1, wherein the process station further comprises:

at least one first temporary storage part, for temporarily storing the substrate which has been processed in the coating unit, so as to wait for entering an exposure machine for exposure processing;

at least one second temporary storage part, for temporarily storing the substrate after exposure processing, so as to wait for entering the developing unit for processing;

wherein the first temporary storage part and the second temporary storage part are installed between the developing unit and the interface station.

17. The coating and developing device according to claim 1, wherein the process station further comprises:

photoresist pumps, installed between the front end module and the coating unit;

photoresist tanks, installed at one side of the mobile conveying part, for storing photoresist, and the photoresist tanks supply the photoresist to the coating modules through the photoresist pumps.

18. A substrate transfer method of a coating and developing device, comprising:

a front end module robot being installed in the front end module taking the substrate from the front end module and transferring the substrate to the process station;

a coating robot being installed in the coating unit of the process station transferring the substrate to the coating unit, and performing coating treatment and heating treatment to the substrate in the coating unit;

the coating robot taking the substrate out of the coating unit after the substrate has been processed in the coating unit;

the side robot transferring the substrate taken from the coating unit to the mobile conveying part;

the mobile conveying part transferring the substrate to the interface station after the substrate has been processed in the coating unit;

an interface robot being installed in the interface station, the interface robot taking the substrate from the mobile conveying part and transferring the substrate to the interface station after the substrate has been processed in the coating unit, or another side robot taking the substrate from the mobile conveying part after the substrate has been processed in the coating unit, and then the interface robot transferring the substrate to the interface station;

the interface robot taking the substrate from the interface station and transferring the substrate to the process station after the substrate has completed of exposure processing;

a developing robot being installed in the developing unit of the process station, the developing robot transferring the substrate to the developing unit, and performing developing treatment and heating treatment to the substrate in the developing unit, wherein the coating unit and the developing unit are arranged in a straight line;

the developing robot taking the substrate from the developing unit after the substrate has been processed in the developing unit;

the side robot transferring the substrate to the mobile conveying part after the substrate is taken out of the developing unit;

the mobile conveying part transferring the substrate to the front end module after the substrate has been processed in the developing unit;

the front end module robot taking the substrate from the mobile conveying part and transferring the substrate to the front end module after the substrate has been processed in the developing unit, or another side robot taking the substrate from the mobile conveying part after the substrate has been processed in the developing unit, and then the front end module robot transferring the substrate to the front end module.

* * * * *